United States Patent
Furutani et al.

(10) Patent No.: US 9,601,422 B2
(45) Date of Patent: Mar. 21, 2017

(54) PRINTED WIRING BOARD, SEMICONDUCTOR PACKAGE, AND METHOD FOR MANUFACTURING PRINTED WIRING BOARD

(71) Applicant: IBIDEN CO., LTD., Ogaki-shi (JP)

(72) Inventors: Toshiki Furutani, Ogaki (JP); Yuki Yoshikawa, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 89 days.

(21) Appl. No.: 14/721,239

(22) Filed: May 26, 2015

(65) Prior Publication Data

US 2015/0340309 A1 Nov. 26, 2015

(30) Foreign Application Priority Data

May 26, 2014 (JP) .................................. 2014-108238

(51) Int. Cl.
*H05K 7/00* (2006.01)
*H01L 23/498* (2006.01)
(Continued)

(52) U.S. Cl.
CPC ........ *H01L 23/49822* (2013.01); *H01L 21/48* (2013.01); *H01L 21/4857* (2013.01); *H01L 23/498* (2013.01); *H01L 23/49811* (2013.01); *H01L 23/49827* (2013.01); *H01L 23/49894* (2013.01); *H05K 1/0271* (2013.01); *H01L 24/16* (2013.01); *H01L 24/48* (2013.01); *H01L 2224/16225* (2013.01); *H01L 2224/48091* (2013.01); *H01L 2224/48227* (2013.01); *H01L 2924/00014* (2013.01); *H01L 2924/15311* (2013.01); *H01L 2924/181* (2013.01); *H05K 3/4682* (2013.01); *H05K 2201/0191* (2013.01); *H05K 2201/0209* (2013.01)

(58) Field of Classification Search
USPC .......................... 361/760, 748, 807; 174/251
See application file for complete search history.

(56) References Cited

U.S. PATENT DOCUMENTS 7,307,852 B2 * 12/2007 Inagaki .................. H01G 4/224
257/E23.062
2014/0262447 A1 * 9/2014 Katsuda ................. H05K 1/185
174/251

FOREIGN PATENT DOCUMENTS

JP 2000-349435 A 12/2000

* cited by examiner

*Primary Examiner* — Andargie M Aychillhum
(74) *Attorney, Agent, or Firm* — Oblon, McClelland, Maier & Neustadt, L.L.P.

(57) ABSTRACT

A printed wiring board includes a first interlayer, a first conductive layer on first-surface side of the first interlayer, a second conductive layer on second-surface side of the first interlayer, a first buildup layer including interlayers and conductive layers and formed on first surface of the first interlayer, and a second buildup layer including interlayers and conductive layers and formed on second surface of the first interlayer. The first conductive layer is formed such that the first conductive layer is embedded in the first interlayer and exposing surface on the first surface of the first interlayer, the second conductive layer is formed on the second surface of the first interlayer, and the interlayers in the first buildup layer include a second interlayer positioned adjacent to the first conductive layer and having the greatest thickness among the first interlayer and interlayers in the first and second buildup layers.

20 Claims, 11 Drawing Sheets

(51) Int. Cl.
   *H01L 21/48*      (2006.01)
   *H05K 1/02*       (2006.01)
   *H01L 23/00*       (2006.01)
   *H05K 3/46*        (2006.01)

PRINTED WIRING BOARD, SEMICONDUCTOR PACKAGE, AND METHOD FOR MANUFACTURING PRINTED WIRING BOARD

CROSS-REFERENCE TO RELATED APPLICATIONS

The present application is based upon and claims the benefit of priority to Japanese Patent Application No. 2014-108238, filed May 26, 2014, the entire contents of which are incorporated herein by reference.

BACKGROUND OF THE INVENTION

Field of the Invention

The present invention relates to a printed wiring board and a semiconductor package, and to a method for manufacturing a printed wiring board. Especially, the present invention relates to a printed wiring board in which warping is reduced and which has a smooth surface so as to enable an electronic component such as a semiconductor element to be mounted at a high yield, and to a method for efficiently manufacturing such a printed wiring board.

Description of Background Art

A buildup wiring board may be made up of core substrate and buildup layers formed by laminating conductive layer and insulation layer on both surfaces of core substrate. Solder-resist layers are formed on predetermined portions of buildup layers (see JP2000-349435A, for example). The entire contents of this publication are incorporated herein by reference.

SUMMARY OF THE INVENTION

According to one aspect of the present invention, a printed wiring board includes a first resin insulation interlayer, a first conductive layer formed on a first-surface side of the first resin insulation interlayer, a second conductive layer formed on a second-surface side of the first resin insulation interlayer on the opposite side with respect to the first-surface side, a first buildup layer including resin insulation interlayers and conductive layers and formed on a first surface of the first resin insulation interlayer such that the first buildup layer is formed on the first conductive layer, and a second buildup layer including resin insulation interlayers and conductive layers and formed on a second surface of the first resin insulation interlayer such that the second buildup layer is formed on the second conductive layer. The first conductive layer is formed such that the first conductive layer is embedded in the first resin insulation interlayer and exposing a surface on the first surface of the first resin insulation interlayer, the second conductive layer is formed on the second surface of the first resin insulation interlayer, and the resin insulation interlayers in the first buildup layer include a second resin insulation interlayer positioned adjacent to the first conductive layer and having the greatest thickness among the first resin insulation interlayer, resin insulation interlayers in the first buildup layer, and resin insulation interlayers in the second buildup layer.

According to another aspect of the present invention, a printed wiring board includes a wiring assembly including resin insulation interlayers and conductive layers such that the conductive layers include a conductive layer formed on a first-surface side of the wiring assembly and a conductive layer formed on a second-surface side of the wiring assembly on the opposite side with respect to the first-surface side, a first buildup layer including resin insulation interlayers and conductive layers and formed on a first surface of the wiring assembly such that the first buildup layer is formed on the conductive layer on the first-surface side of the wiring assembly, and a second buildup layer including resin insulation interlayers and conductive layers and formed on a second surface of the wiring assembly such that the second buildup layer is formed on the conductive layer on the second-surface side of the wiring assembly. The conductive layer on the first-surface side of the wiring assembly is formed such that the conductive layer is embedded in the outermost resin insulation interlayer on the first-surface side and exposing a surface on the first surface of the wiring assembly, the second conductive layer on the second-surface side of the wiring assembly is formed on a surface of the outermost resin insulation interlayer on the second-surface side of the wiring assembly, and the resin insulation interlayers in the first buildup layer include a resin insulation interlayer positioned adjacent to the conductive layer on the first-surface side of the wiring assembly and having the greatest thickness among the resin insulation interlayers in the wiring assembly, resin insulation interlayers in the first buildup layer, and resin insulation interlayers in the second buildup layer.

According to yet another aspect of the present invention, a method for manufacturing a printed wiring board includes forming a first conductive layer on a surface of a support plate, forming a first resin insulation interlayer on the support plate such that the first conductive layer is embedded in the first resin insulation interlayer, laminating a metal foil on the first resin insulation interlayer, forming a hole for a via conductor such that the hole penetrates through the first resin insulation interlayer and the metal foil, forming a seed layer on the metal foil such that he seed layer is formed in the hole and on the metal foil, applying electroplating on the seed layer such that a via conductor is formed in the hole and a second conductive layer is formed on the first resin insulation interlayer, separating the support plate from the first resin insulation interlayer such that a surface of the first conductive layer embedded in the first resin insulation interlayer is exposed on a first surface of the first resin insulation interlayer, laminating insulative material on the first surface of the first conductive layer such that a second resin insulation interlayer is formed adjacent to the first conductive layer, and laminating insulative material on a second surface of the first resin insulation interlayer such that a resin insulation interlayer is formed on the second conductive layer. The second resin insulation interlayer has the greatest thickness among the first resin insulation interlayer, second resin insulation interlayer and resin insulation interlayer laminated on the second surface of the first resin insulation interlayer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
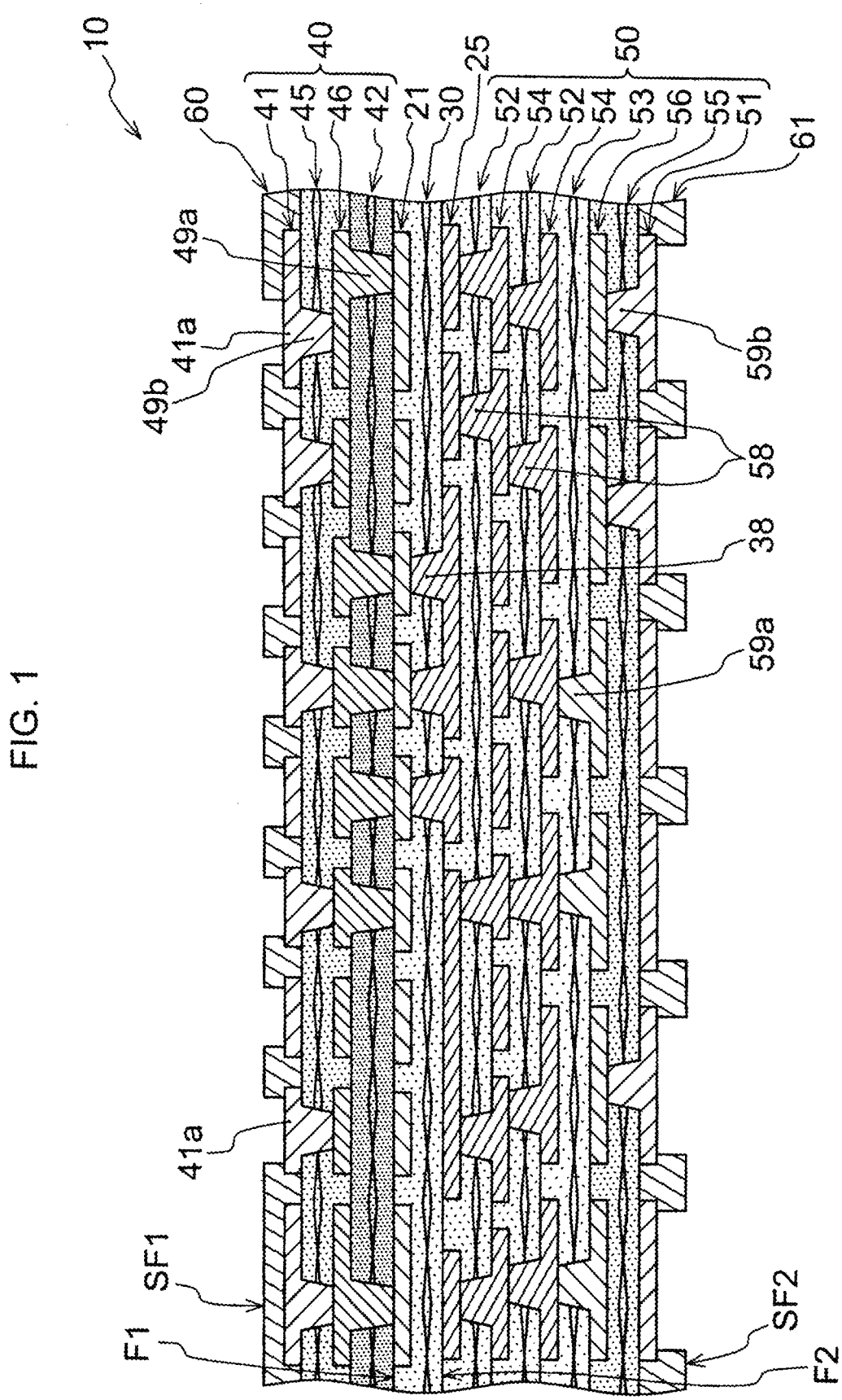
FIG. 1 is a cross-sectional view of the printed wiring board according to an embodiment of the present invention.

The embodiments will now be described with reference to the accompanying drawings, wherein like reference numerals designate corresponding or identical elements throughout the various drawings.

Figure 2:
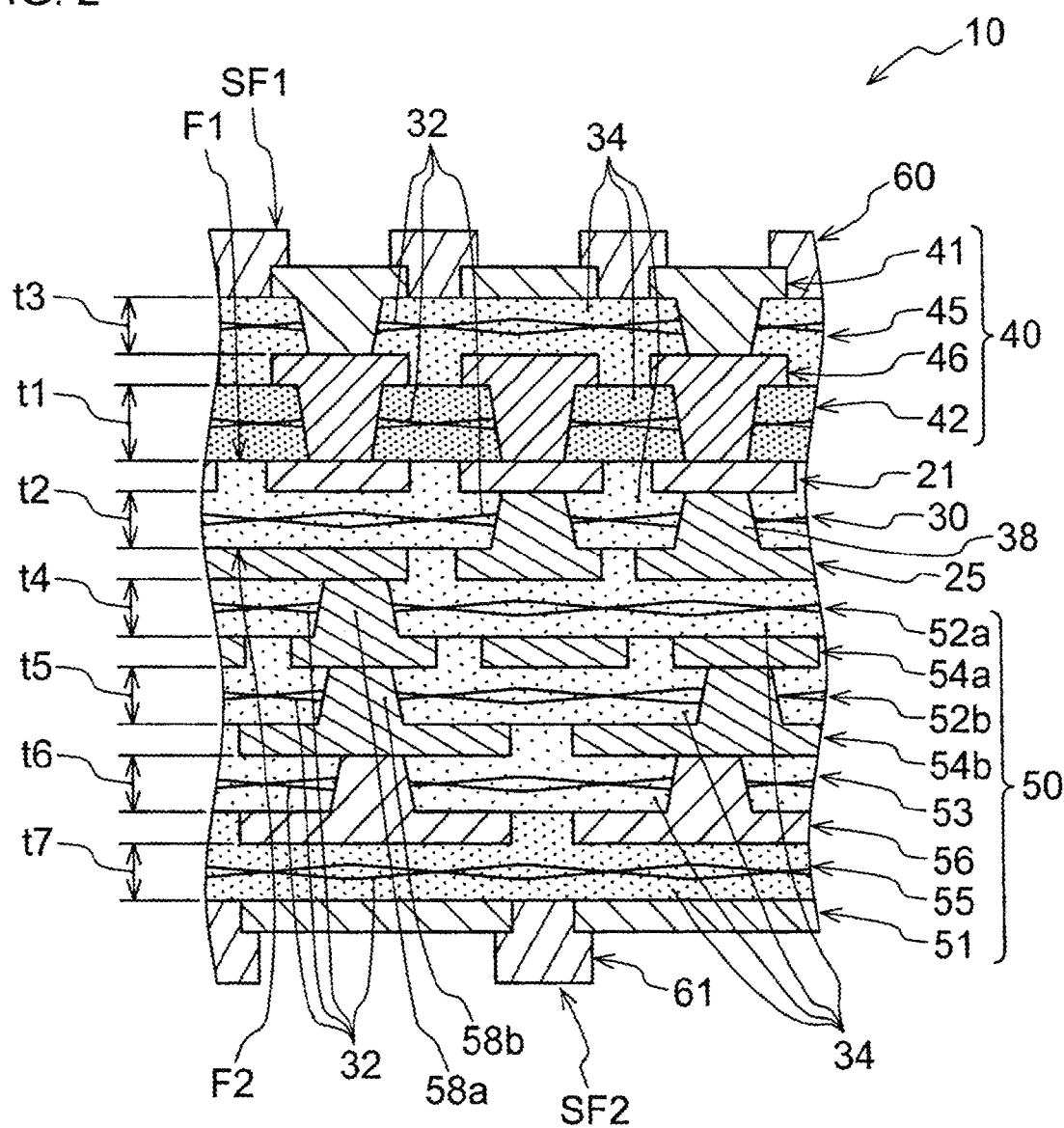
FIG. 2 is an enlarged view showing the central portion of the printed wiring board shown in FIG. 1.

A printed wiring board according to an embodiment of the present invention is described with reference to the accompanying drawings. Printed wiring board 10 (hereinafter, a printed wiring board may also be referred to simply as a wiring board) according to an embodiment of the present invention is provided with first interlayer resin insulation layer 30 having first surface (F1) and second surface (F2) opposite first surface (F1), first conductive layer 21 formed on first surface (F1) of first interlayer resin insulation layer 30, second conductive layer 25 formed on second surface (F2) of first interlayer resin insulation layer 30, first buildup layer 40 formed on first surface (F1) of first interlayer resin insulation layer 30, and second buildup layer 50 formed on second surface (F2) of first interlayer resin insulation layer 30. Second conductive layer 25 is formed on second surface (F2) of first interlayer resin insulation layer 30. In wiring board 10 of the present embodiment, first conductive layer 21 is embedded in first interlayer resin insulation layer 30 so that the surface on the first-buildup-layer side is exposed on first surface (F1) of first interlayer resin insulation layer 30. Accordingly, first surface (F1) of first interlayer resin insulation layer 30 is made substantially flush with the one surface of first conductive layer 21, thereby making first surface (F1) a substantially flat surface as shown in FIG. 2. In addition, second interlayer resin insulation layer 42, which is an interlayer resin insulation layer in first buildup layer 40 and adjacent to first conductive layer 21, is formed to be thick. In the present embodiment, second interlayer resin insulation layer 42 is made the thickest among first interlayer resin insulation layer 30, interlayer resin insulation layers in first buildup layer 40 (second interlayer resin insulation layer 42 and third interlayer resin insulation layer 45 in the example shown in FIG. 2), and the interlayer resin insulation layers in second buildup layer 50 (interlayer resin insulation layers (52a, 52b, 53) and fourth interlayer resin insulation layer 55 in the example shown in FIG. 2). In the following descriptions, regarding relative positional relationships in a thickness direction of wiring board 10, the side farther from first interlayer resin insulation layer 30 is referred to as the "upper side" or "outer side," and the side closer to first interlayer resin insulation layer 30 as the "lower side" or "inner side," unless otherwise specified. In addition, based on the definition, a surface positioned on the "upper side" may also be referred to as an "upper surface" and a surface positioned on the "lower side" as a "lower surface."

An insulation layer laminated on a printed wiring board is formed to have an approximate thickness of 20~100 μm so that demand for a thinner wiring board is satisfied while appropriate rigidity is maintained. Meanwhile, a conductive layer such as first conductive layer 21 is formed to have at least an approximate thickness of 5~30 μm so that a predetermined level of conductivity is obtained. As a result, when a conductive layer is formed and patterned on an insulation layer laminated in a printed wiring board, the insulation layer laminated on the conductive layer is unable to absorb height differences stemming from the thickness of the conductive layer, thus showing undulations on the surface (for example, height differences between the surface of conductive layer 911 and the surface of insulation layer 915 are apparent on the surface of insulation layer 925 in FIG. 6). As a result, undulations corresponding to patterns of the inner conductive layer may appear on the surface of a printed wiring board. As a printed wiring board becomes further multilayered, height differences derived from each conductive layer are accumulated, causing undulations with even greater height differences on a surface of the printed wiring board. Occasions of such undulations are thought to further increase as insulation layers are made thinner according to demand for thinner printed wiring boards. In addition, when undulations are apparent on a surface of a wiring board, some connection pads on the wiring board surface may fail to make contact with the electrodes of an electronic component to be mounted on the wiring board. Accordingly, the mounting yield of an electronic component on the wiring board may decline. Such occasions are thought to increase significantly as semiconductor elements or the like are formed in a larger size as they become more highly functional and their electrodes are arranged at a finer pitch.

In wiring board 10 of the present embodiment, first conductive layer 21 formed on first surface (F1) of first interlayer resin insulation layer 30 is embedded in first interlayer resin insulation layer 30 in such a way to expose only one surface from first interlayer resin insulation layer 30 as shown in FIG. 2. Thus, first surface (F1) is formed to be a substantially flat surface without showing height differences as shown in FIG. 1. Accordingly, undulations derived from the patterns of first conductive layer 21 are at least prevented from appearing on the first-buildup-layer 40 side surface (hereinafter, the first-buildup-layer 40 side surface of wiring board 10 may also be referred to simply as first surface (SF1)). In addition, since height differences of conductive layer 46 do not overlap those of conductive layer 21, greater undulations are prevented. As a result, connection pads (41a) formed on first surface (SF1) of wiring board 10 seldom fail to make contact with electrodes 91 of an electronic component such as semiconductor element 90 (see FIG. 4K). Accordingly, the mounting yield of an electronic component on wiring board 10 is prevented from lowering. Therefore, when a large-sized semiconductor element or the like having fine-pitched terminals (electrodes) is mounted on wiring board 10, it is preferred to mount the electronic component on first surface (SF1), namely, on third conductive layer 41 of the present embodiment, rather than mounting it on the second-buildup-layer 50 side surface of wiring board 10 (hereinafter, the second-buildup-layer 50 side surface of wiring board 10 may also be referred to simply as second surface (SF2)). By so setting, a large-sized semiconductor element or the like with fine-pitched terminals can be mounted at a higher yield.

In addition, if a large-sized semiconductor element or the like is mounted only on one side of a wiring board, due to a lower thermal expansion coefficient of a semiconductor element or the like than that of insulation layers in a wiring board, warping is likely to occur, causing the side with a mounted semiconductor element to be recessed at high temperatures and to protrude at lower temperatures. When a large-sized electronic component is mounted on one side of a wiring board, the area of the solder-resist layer tends to be smaller than that on the other side of the wiring board. As a result, when the temperature changes, the amount of expansion/contraction on the one side is smaller than the amount on the other side, thus causing greater warping. When a printed wiring board warps, since stress is generated in the connection portions of each electronic component mounted on the printed wiring board, the connection reliability of the electronic component may decrease.

Warping in a printed wiring board is suppressed when the amount of expansion/contraction caused by temperature change is greater on the side with a mounted electronic component. One way to increase the degree of expansion/contraction is to increase the amount of the resin composition with a greater thermal expansion coefficient in the material used for forming a printed wiring board on the side to mount a semiconductor element. In particular, such an effect is achieved by increasing the thickness of an insulation layer to be laminated on the side to mount a semiconductor element.

In wiring board 10 of the present embodiment, second interlayer resin insulation layer 42 adjacent to first conductive layer 21 is made thicker than other interlayer resin insulation layers in printed wiring board 10 as described above. Namely, in the example shown in FIG. 2, thickness (t1) of second interlayer resin insulation layer 42 is made greater than any of thicknesses (t2~47) respectively of first interlayer resin insulation layer 30, third interlayer resin insulation layer 45 in first buildup layer 40, interlayer resin insulation layers (52a, 52b, 53) and fourth interlayer resin insulation layer 55 in second buildup layer 50. Therefore, when second interlayer resin insulation layer 42 with a greater thickness is laminated by being shifted from the center of wiring board 10 in a thickness direction toward the side where a large-sized semiconductor element is mounted, the aforementioned warping in the printed wiring board will be mitigated. In the example shown in FIG. 2, second buildup layer 50 is formed to include four interlayer resin insulation layers, that is, there are two more interlayer resin insulation layers than the number of interlayer resin insulation layers (two) in first buildup layer 40. Accordingly, second interlayer resin insulation layer 42 is positioned away from the center of wiring board 10 in a thickness direction toward first surface (SF1), thereby increasing effectively the amount of expansion/contraction on the first-surface (SF1) side when temperatures change. As a result, when a large-sized semiconductor element or the like is mounted on first surface (SF1) and no semiconductor element or the like is mounted on second surface (SF2), the aforementioned warping, namely, a recess at higher temperatures and a protrusion at lower temperatures observed on the semiconductor-mounted side, is suppressed in wiring board 10. Therefore, connection reliability of the electronic component (not shown) mounted on wiring board 10 is prevented from decreasing.

As shown in FIG. 2, first buildup layer 40 is formed by laminating interlayer resin insulation layers and conductive layers from the first-surface (F1) side of first interlayer resin insulation layer 30, while second buildup layer 50 is formed by laminating interlayer resin insulation layers and conductive layers from the second-surface (F2) side of first interlayer resin insulation layer 30. In the example shown in FIG. 2, first buildup layer 40 has two interlayer resin insulation layers and two conductive layers. More specifically, first buildup layer 40 is formed by alternately laminating second interlayer resin insulation layer 42, conductive layer 46, third interlayer resin insulation layer 45 and third conductive layer 41 in that order from the first-surface (F1) side. Second buildup layer 50 has four interlayer resin insulation layers and four conductive layers. More specifically, second buildup layer 50 is formed by alternately laminating interlayer resin insulation layer (52a), conductive layer (54a), interlayer resin insulation layer (52b), conductive layer (54b), interlayer resin insulation layer 53, conductive layer 56, fourth interlayer resin insulation layer 55 and fourth conductive layer 51 in that order from the second-surface (F2) side of first interlayer resin insulation layer 30.

First buildup layer 40 and second buildup layer 50 may each be formed by laminating an even greater number of interlayer resin insulation layers and conductive layers, depending on the size of circuits or on the wiring density formed in wiring board 10. Also, first buildup layer 40 and second buildup layer 50 may be formed by laminating fewer interlayer resin insulation layers and conductive layers than those in the example shown in FIG. 2; for example, they may each be formed by laminating only one interlayer resin insulation layer and one conductive layer. If first buildup layer 40 is formed using fewer conductive layers, there are fewer conductive layers between substantially flat first surface (F1) of first interlayer resin insulation layer 30 and first surface (SF1) of wiring board 10, thereby effectively reducing undulations appearing on first surface (SF1). Also, by setting second buildup layer 50 to have more layers than first buildup layer 40, second interlayer resin insulation layer 42 made thicker than other interlayer resin insulation layers is positioned on the first-surface (SF1) side. Such positioning in wiring board 10 is effective in reducing warping, which tends to occur when a large-sized semiconductor element or the like is mounted only on first surface (SF1).

In the present embodiment, first interlayer resin insulation layer 30, second interlayer resin insulation layer 42, third interlayer resin insulation layer 45, fourth interlayer resin insulation layer 55, interlayer resin insulation layers (52a, 52b) (hereinafter, interlayer resin insulation layers (52a, 52b) may also be referred to collectively as interlayer resin insulation layers 52 unless they are distinguished from each other) and interlayer resin insulation layer 53 each include core material 32 and resin material 34 made of a resin composition as shown in FIG. 2. Alternatively, first through fourth interlayer resin insulation layers (30, 42, 45, 55) and interlayer resin insulation layers (52a, 52b, 53) may be formed with semicured prepreg prepared by impregnating core material 32 with resin material 34. Core material 32 is not limited specifically, and is preferred to be made of inorganic fiber such as glass fiber with excellent insulation and rigidity properties. Resin material 34 is not limited specifically as long as it exhibits pressure-resistance and insulation properties for wiring board 10; for example, epoxy resin, bismaleimide triazine resin (BT resin) or the like, preferably epoxy resin, may be used. Also, resin material 34 may be filled with inorganic filler made of silica or alumina. However, first through fourth interlayer resin insulation layers (30, 42, 45, 55) and interlayer resin insulation layers (52a, 52b, 53) may each be formed by any other material, and materials different from the above-listed materials may also be used for core material 32 or resin material 34.

Alternatively, first through fourth interlayer resin insulation layers (30, 42, 45, 55) and interlayer resin insulation layers (52a, 52b, 53) may be formed without containing core material 32, namely, by using only resin material 34 not impregnated in core material 32. When first through fourth interlayer resin insulation layers (30, 42, 45, 55) and interlayer resin insulation layers (52a, 52b, 53) are formed by using resin material 34 only, the adhesiveness of electroless plated film to those surfaces may improve. Thus, in the later-described method for manufacturing wiring board 10, it is possible to form conductive layer 46 without using metal foil (not shown) to be laminated on second interlayer resin insulation layer 42. In addition, resin material 34, whether or not it is impregnated in core material 32, may be filled with inorganic filler or the like (not shown) made of silica, alumina or the like. In such a case, the inorganic filler content is preferred to be 30~70 wt. % based on the total weight of each interlayer resin insulation layer, because such a setting causes the thermal expansion coefficient of first through fourth interlayer resin insulation layers (30, 42, 45, 55) and interlayer resin insulation layers (52a, 52b, 53) to be close to the thermal expansion coefficient of the electronic component (not shown) mounted on wiring board 10, while maintaining adhesiveness with the conductive layer formed on each interlayer resin insulation layer.

Yet alternatively, first through fourth interlayer resin insulation layers (30, 42, 45, 55) and interlayer resin insulation layers (52a, 52b, 53) may be formed using different materials from each other. For example, first interlayer resin insulation layer 30 may be formed using different material from that for interlayer resin insulation layers such as third interlayer resin insulation layer 45 in first buildup layer 40 or interlayer resin insulation layers in second buildup layer 50. For example, as described later, resin material containing core material 32 is used for first interlayer resin insulation layer 30, on which second conductive layer 25 (see FIG. 4C) is formed using metal foil 251. On the other hand, if metal film is directly formed on third interlayer resin insulation layer 45 by electroless plating when third conductive layer 41 is formed on third interlayer resin insulation layer 45, interlayer insulative film not containing core material 32 and having excellent adhesiveness with plated film (such as brand name: ABF-45SH made by Ajinomoto Fine-Techno Co., Inc.) may be used for third interlayer resin insulation layer 45 as described earlier.

However, among the interlayer resin insulation layers of wiring board 10, third interlayer resin insulation layer 45, laminated as the outermost insulation layer of first buildup layer 40, is preferred to be made of the same material and to have the same thickness as fourth interlayer resin insulation layer 55, laminated as the outermost insulation layer of second buildup layer 50. By so setting, it is convenient to form third interlayer resin insulation layer 45 and fourth interlayer resin insulation layer 55 simultaneously on both sides of intermediate substrate (10a) of wiring board 10 (see FIG. 4I), and wiring board 10 is thereby manufactured efficiently during the manufacturing process of wiring board 10. When first buildup layer 40 is formed by laminating even more interlayer resin insulation layers, in addition to third and fourth interlayer resin insulation layers (45, 55), if interlayer resin insulation layers laminated on the inner sides adjacent to third and fourth interlayer resin insulation layers (45, 55) respectively are formed to have the same material and/or the same thickness for the same reason as above, then it is also convenient to simultaneously form interlayer resin insulation layers positioned on their respective adjacent inner sides. Namely, if each interlayer resin insulation layer positioned on a certain tier in first buildup layer 40 (certain number of layers counted from third interlayer resin insulation layer 45 to its own tier) is made of at least the same material as that for the interlayer resin insulation layer positioned on the tier in second buildup layer 50 corresponding to its own tier (the same number of layers counted from fourth interlayer resin insulation layer 55), it is convenient to form those interlayer resin insulation layers simultaneously. Such setting makes it more convenient to form each one of interlayer resin insulation layers in first buildup layer 40 at the same time as an interlayer resin insulation layer in second buildup layer 50 to be formed on its corresponding position (tier). Therefore, it is preferred for each interlayer resin insulation layer in first buildup layer 40 to be formed using at least the same material as that for the interlayer resin insulation layer positioned to have the same tier number counted from fourth interlayer resin insulation layer 55 as its own tier number counted from third interlayer resin insulation layer 45. In the example shown in FIG. 2, if second interlayer resin insulation layer 42 and interlayer resin insulation layer 53 are made of the same material, while third interlayer resin insulation layer 45 and fourth interlayer resin insulation layer 55 are made of the same material, it is convenient to simultaneously form first buildup layer 40 and its corresponding portion in second buildup layer 50.

As described above, to think that first buildup layer 40 and its corresponding portion in second buildup layer 50 are formed simultaneously, wiring board 10 of the present embodiment may also be understood as follows by referring to FIG. 3. Namely, wiring board 10 in another example of the present embodiment is made up of the following: wiring assembly 11 which is formed by alternately laminating interlayer resin insulation layers such as first interlayer resin insulation layer 30 and interlayer resin insulation layers (52a, 52b) and conductive layers such as second conductive layer 25 and conductive layer (54a), and which is provided with first conductive layer 21 on surface (F3) and conductive layer (54b) on surface (F4) opposite surface (F3); first buildup layer 40 formed on surface (F3) of wiring assembly 11; and second buildup layer (50a) formed on the other surface (F4) of wiring assembly 11. First buildup layer 40 is formed by laminating second interlayer resin insulation layer 42, conductive layer 46, third interlayer resin insulation layer 45 and third conductive layer 41 in that order, namely, by alternately laminating an interlayer resin insulation layer and a conductive layer multiple times. Second buildup layer (50a) is formed by laminating interlayer resin insulation layer 53, conductive layer 56, fourth interlayer resin insulation layer 55 and fourth conductive layer 51 in that order, namely, by alternately laminating an interlayer resin insulation layer and a conductive layer multiple times. Therefore, in the manufacturing process for wiring board 10 according to the example shown in FIG. 3, after wiring assembly 11 is formed, first buildup layer 40 on surface (F3) and second buildup layer (50a) on the other surface (F4) of wiring assembly 11 are formed preferably at the same time. Here, if interlayer resin insulation layers in first buildup layer 40 and interlayer resin insulation layers in second buildup layer (50a), which are laminated respectively to have the same tier number counted from wiring assembly 11, are formed using the same material, then it is more convenient to form first buildup layer 40 and second buildup layer (52a) at the same time. Namely, in the example shown in FIG. 3, second interlayer resin insulation layer 42 and interlayer resin insulation layer 53, as well as third interlayer resin insulation layer 45 and fourth interlayer resin insulation layer 55, are preferred to be formed using the same material.

Figure 3:
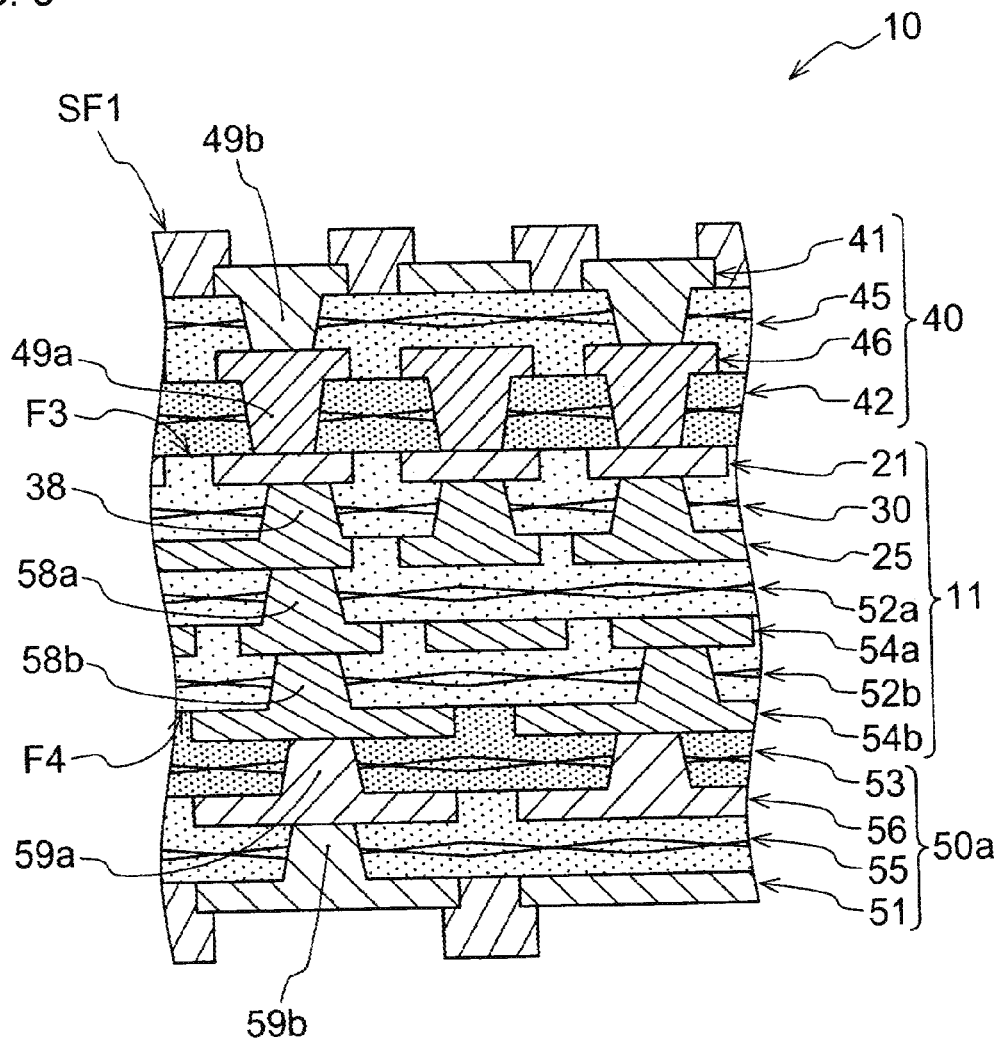
FIG. 3 is an enlarged view showing another example of the printed wiring board of the embodiment, different from an example shown in FIG. 2.

In the example shown in FIG. 3 as well, conductive layer (54b) is formed on interlayer resin insulation layer (52b), which is the outermost layer on the surface (F4) side of wiring assembly 11. By contrast, first conductive layer 21 is embedded in first interlayer resin insulation layer 30, which is the outermost layer on the surface (F3) side of wiring assembly 11, in such a way to expose one of its surfaces from first interlayer resin insulation layer 30. Accordingly, undulations that reflect the patterns of first conductive layer 21 are prevented from appearing on first surface (SF1) of wiring board 10. Also, in the example shown in FIG. 3 as well, second interlayer resin insulation layer 42, which is positioned in first buildup layer 40 and adjacent to surface (F3) of wiring assembly 11, is set to have the greatest thickness among interlayer resin insulation layers in first buildup layer 40, interlayer resin insulation layers in second buildup layer (50a) and the interlayer resin insulation layers in wiring assembly 11. Thus, in the example shown in FIG. 3 as well, warping in wiring board 10 is suppressed, and connection reliability of an electronic component (not shown) to be mounted on wiring board 10 is prevented from lowering. The numbers of conductive layers and interlayer resin insulation layers formed respectively in wiring assembly 11, first buildup layer 40 and second buildup layer (50a) are not limited to those shown in FIG. 3, and greater numbers, or lower numbers, of conductive layers and interlayer resin insulation layers may also be employed.

First conductive layer 21 is embedded in first interlayer resin insulation layer 30 in such a way to expose only the first-buildup-layer 40 side surface from first surface (F1) of first interlayer resin insulation layer 30 as shown in FIG. 2. Embedding first conductive layer 21 in first interlayer resin insulation layer 30 is effective to form a substantially flat surface on first surface (F1) as described above, and it is also effective to adhere first conductive layer 21 strongly to first interlayer resin insulation layer 30. Thus, when first conductive layer 21 is patterned to have a narrow width (not shown), the wiring pattern is unlikely to be peeled from first interlayer resin insulation layer 30. In addition, since first interlayer resin insulation layer 30 is present between adjacent wiring patterns, even when wiring patterns are arranged parallel at a narrow pitch, short circuiting of the wiring patterns through solder is less likely to occur in wiring patterns for connection with the electronic component (not shown). The method for forming first conductive layer 21 is not limited specifically, but it is preferred to use electroplating as described later, since a thick film can be formed in a short period of time. The material for conductive layer 21 is not limited specifically, but copper is preferred since it is highly conductive and inexpensive, and deposits well during electroplating.

As shown in FIG. 2, second conductive layer 25 is formed on second surface (F2) of first interlayer resin insulation layer 30. In the present embodiment, conductive layers (54a, 54b) are formed respectively on interlayer resin insulation layers (52a, 52b). The method for forming second conductive layer 25 and conductive layers (54a, 54b) (hereinafter, conductive layers (54a, 54b) may also be referred to collectively as conductive layers 54 unless it is to distinguish them from each other) is not limited specifically. For example, second conductive layer 25 may be formed by laminating metal foil 251 made of copper, for example (see FIG. 4C), on a surface of first interlayer resin insulation layer 30, and depositing first metal film 252 through electroless plating (see FIG. 4D) and second metal film 253 through electroplating (see FIG. 4E) on the surface of metal foil 251. The same applies to conductive layers (54a, 54b). In such a case, second conductive layer 25 and conductive layers (54a, 54b) are formed with three layers of metal foil, electroless plated film and electroplated film. However, that is not the only option, and second conductive layer 25 and conductive layers (54a, 54b) may also be formed only with electroplated film, for example. The material for second conductive layer 25 and conductive layers (54a, 54b) is not limited specifically; any conductive material, preferably metallic material such as copper and nickel, may be used. However, for the same reason as in first conductive layer 21, copper is used for metal foil, electroless plated film and electroplated film.

As shown in FIG. 2, second interlayer resin insulation layer 42 of the first buildup layer 40 is laminated on first conductive layer 21 and on portions of first interlayer resin insulation layer 30 where first conductive layer 21 is not embedded. As described above, thickness (t1) of second interlayer resin insulation layer 42 (in the present embodiment, the length between the upper surface of first conductive layer 21 and the lower surface of conductive layer 46) is set greater than any of thickness (t2) of first interlayer resin insulation layer 30 (in the present embodiment, the length between the first-conductive-layer 21 side surface of second conductive layer 25 and the second-conductive-layer 25 side surface of first conductive layer 21), and thicknesses (t3~t7) of third interlayer resin insulation layer 45, interlayer resin insulation layers (52a, 52b, 53) and fourth interlayer resin insulation layer 55 (lengths each measured between the upper surface of a conductive layer formed on the lower side of each interlayer resin insulation layer and the lower surface of a conductive layer formed on the upper side of each interlayer resin insulation layer; for example, thickness (t3) is the length between the upper surface of conductive layer 46 and the lower surface of third conductive layer 41). As a result, warping in wiring board 10 is suppressed as described above.

In the present embodiment, conductive layer 46 is formed on second interlayer resin insulation layer 42, and third conductive layer 41 is formed on third interlayer resin insulation layer 45 laminated on conductive layer 46. In addition, conductive layer 56 is formed on interlayer resin insulation layer 53, and the fourth conductive layer is formed on fourth interlayer resin insulation layer 55 laminated on conductive layer 56.

As shown in FIG. 1, third conductive layer 41 is formed on first surface (SF1) of wiring board 10, and fourth conductive layer 51 is formed on second surface (SF2). In third conductive layer 41, connection pads (41a) for connection with electrodes 91 (see FIG. 4K) of semiconductor element 90 (see FIG. 4K) may be formed, and connection pads for connection with another electronic component (not shown) may also be formed. In addition, fourth conductive layer 51 may also have any conductive patterns that include connection pads (51a) for connection with another electronic component or an external wiring board for mounting wiring board 10.

The method for forming third and fourth conductive layers (41, 51) and conductive layers (46, 56) is not limited specifically, and those conductive layers may be formed using the same method as that for second conductive layer 25 and conductive layer 54, for example. Namely, third conductive layer 41 may be formed, for example, by laminating a metal foil (not shown) made of copper, for example, on third interlayer resin insulation layer 45, and by depositing electroless plated film and electroplated film (not shown) on the metal foil. However, third and fourth conductive layers (41, 51) and conductive layers (46, 56) are not limited to having the above structure, and may be formed only with electroplated film. The material for third and fourth conductive layers (41, 51) and conductive layers (46, 56) are not limited specifically, and metallic material such as copper and nickel is preferred the same as for the aforementioned second conductive layer 25 and conductive layer 54; copper is especially preferred for metal foil, electroless plated film and electroplated film.

In wiring board 10 of the present embodiment, via conductors 38 are formed to penetrate through first interlayer resin insulation layer 30 as shown in FIG. 2. Via conductors 38 connect first conductive layer 21 and second conductive layer 25. Also, via conductors (58a) are formed in interlayer resin insulation layer (52a), and via conductors (58b) are formed in interlayer resin insulation layer (52b). Via conductors (58a) connect second conductive layer 25 and conductive layer (54a), and via conductors (58b) connect conductive layer (54a) and conductive layer (54b). Also as shown in FIG. 1, in wiring board 10, via conductors (49a) are formed to penetrate through second interlayer resin insulation layer 42 and connect first conductive layer 21 and conductive layer 46, and via conductors (49b) are formed to penetrate through third interlayer resin insulation layer 45 and connect conductive layer 46 and third conductive layer 41. Furthermore, via conductors (59a) are formed to penetrate through interlayer resin insulation layer 53 and connect conductive layer (54b) and conductive layer 56, and via conductors (59b) are formed to penetrate through fourth interlayer resin insulation layer 55 and connect conductive layer 56 and fourth conductive layer 51. Via conductors may each be formed in any position, for example, via conductors may be formed to overlap each other at one portion or at multiple portions when seen on a plan view. Namely, as shown in FIG. 3, via conductors (49b, 49a, 38, 58a, 58b, 59a, 59b) may be formed to be substantially positioned directly on top of (below) each other so that third conductive layer 41 and fourth conductive layer 51 are electrically connected by a conductive route formed as a substantially straight line.

Regarding via conductors 38 and via conductors (49a, 49b) (hereinafter, via conductors (49a, 49b) may also be referred to collectively as via conductors 49 unless it is to distinguish them from each other), via conductors (58a, 58b) (hereinafter, via conductors (58a, 58b) may also be referred to collectively as via conductors 58 unless it is to distinguish them from each other), and via conductors (59a, 59b) (hereinafter, via conductors (59a, 59b) may also be referred to collectively as via conductors 59 unless it is to distinguish them from each other), the method for forming those via conductors is not limited specifically. As described later, via conductors 38 are formed when holes 37 for conductor penetrating through first interlayer resin insulation layer 30 are formed by irradiating a $CO_2$ laser, for example, and when first metal film 252 (see FIG. 4D) formed by electroless plating and second metal film 253 (see FIG. 4E) formed by electroplating are filled in the holes. In the same manner, via conductors (49a, 49b, 58a, 58b, 59a, 59b) may also be formed respectively in second interlayer resin insulation layer 42, third interlayer resin insulation layer 45 and interlayer resin insulation layers (52a, 52b, 53 and fourth interlayer resin insulation layer 55). In the example shown in FIG. 4E, holes 37 for conductor for forming via conductors 38 are completely filled with second metal film 253. However, that is not the only option, and holes 37 for conductor may not be filled completely. The same applies to via conductors (49, 58, 59). The material for via conductors (38, 49, 58, 59) is not limited specifically, and copper is preferred since it deposits well during plating and is highly conductive and inexpensive.

In the present embodiment, via conductors (49a, 49b) are each formed to have a cross section on a plane perpendicular to a thickness direction of wiring board 10 (hereinafter, a cross section on such a plane is simply referred to as a horizontal cross section) in a shape that is smaller on the first-conductive-layer 21 side than on the third-conductive-layer 41 side as shown in FIG. 1. On the other hand, via conductors (58, 59a, 59b) are each formed to have a horizontal cross section shaped to be smaller on the second-conductive-layer 25 side than on the fourth-conductive-layer 51 side, and via conductors 38 are formed to have a horizontal cross section shaped to be smaller on the first-conductive-layer 21 side than on the second-conductive-layer 25 side. Namely, via conductors 49 and via conductors (58, 59, 38) are formed in such a way that their horizontal cross sections become greater in opposite directions from each other; in other words, their horizontal cross sections become smaller in opposite directions from each other. As described later, holes 37 for conductor (see FIG. 4D) are formed by irradiating a $CO_2$ laser or the like at first interlayer resin insulation layer 30 from the second-conductive-layer 25 side, and holes (not shown) for via conductors (58, 59) are formed by irradiating the laser at fourth interlayer resin insulation layer 55, interlayer resin insulation layer 52 and the like from the fourth-conductive-layer 51 side. On the other hand, holes (not shown) for via conductors 49 are formed by irradiating a $CO_2$ laser or the like at third interlayer resin insulation layer 45 and the like from the third-conductive-layer 41 side. By so doing, via conductors (38, 49a, 49b, 58, 59a, 59b) each tend to have a horizontal cross section that becomes greater (smaller) in a direction shown in FIG. 1.

In the present embodiment, solder-resist layer 60 is formed on third interlayer resin insulation layer 45 and on portions of third conductive layer 41 excluding where connection pads (41a) to connect semiconductor element 90 (see FIG. 4K) are formed. Also, solder-resist layer 61 is formed on fourth interlayer resin insulation layer 55 and on portions of fourth conductive layer 51 excluding connection pads (51a). The portions for forming solder-resist layers (60, 61) are not limited specifically, and solder-resist layers may be formed on any portions of third and fourth conductive layers (41, 51) depending on the type and the number of electronic component (not shown) to be mounted on wiring board 10. Alternatively, any portions of conductive layers (41, 51) may be exposed without being covered by solder-resist layers (60, 61).

The material for solder-resist layers (60, 61) is not limited specifically as long as it exhibits excellent insulation and resistance to soldering heat. For example, epoxy resin, acrylic resin or the like may be used; a preferred material is epoxy resin containing inorganic fillers such as $SiO_2$ at 40~70 wt. %.

In addition, portions of third and fourth conductive layers (41, 51) without being covered by solder-resist layers (60, 61), for example, connection pads (41a, 51a), may be covered by an anticorrosion layer or solder coating layer (not shown) made of, for example, Ni/Au, Ni/Pd/Au, Sn, or organic solderability preservative (OSP) and the like.

Next, by referring to FIG. 4A~4K, a method for manufacturing wiring board 10 of the embodiment is described with reference to FIG. 4A-4K.

Figure 4A:
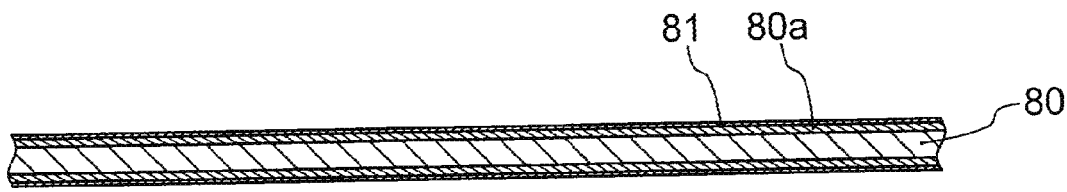
FIG. 4A is a view illustrating a step in a method for manufacturing the printed wiring board shown in FIG. 1.

In the method for manufacturing wiring board 10 of the present embodiment, first, as shown in FIG. 4A, support plate 80, carrier copper foil (80a) and base metal foil 81 are prepared as starting materials, and carrier copper foil (80a) is laminated on both surfaces of support plate 80, which are then hot-pressed to be bonded to each other. A semicured prepreg or the like, made by impregnating core material such as glass cloth with insulative resin such as epoxy resin, may be used for support plate 80. However, that is not the only option, and any other material may also be used. The material for base metal foil 81 is not limited specifically as long as later described first conductive layer 21 (see FIG. 4B) is formed on its surface; preferably copper foil or nickel foil with a thickness of 2~6 μm, more preferably copper foil with a thickness of 5 μm, is used. Also, as the material for carrier copper foil (80a), copper foil with a thickness of 15~30 μm, preferably 18 μm, is used. However, thicknesses of base metal foil 81 and carrier copper foil (80a) are not limited to the above, and any other thickness may be employed.

The method for bonding carrier copper foil (80a) and base metal foil 81 is not limited specifically. For example, a thermoplastic adhesive (not shown) may be used on substantially the entire surface of their bonding surfaces. Alternatively, portions near the peripheries, where later-described conductive patterns of first conductive layer 21 will not be formed (see FIG. 4B), may be bonded using an adhesive or by ultrasonic bonding. In addition, carrier copper foil (80a) and base metal foil 81 may be bonded before carrier copper foil (80a) is bonded to support plate 80, but that is not the only option. For example, a double-sided copper-clad laminate is used for support plate 80, and single base metal foil 81 may be bonded, using the aforementioned method or the like, to the copper foil already bonded on both surfaces of the double-sided copper-clad laminate, thus substituting carrier copper foil (80a).

FIG. 4A~4F show an example of the manufacturing method, where base metal foil 81 is bonded to both surfaces of support plate 80, and first and second conductive layers (21, 25), first interlayer resin insulation layer 30 and part of second buildup layer 50 are formed respectively on each of both surfaces. Using such a manufacturing method is preferred, since two sets of first and second conductive layers (21, 25) and the majority of second buildup layer 40 are formed simultaneously. However, first conductive layer 21 and the like may be formed only on one side of support plate 80, or conductive layers with different circuit patterns from each other may be formed on either side. In the following descriptions, FIG. 4A~4F show an example where the same circuit patterns are formed on both surfaces. Accordingly, only one side is used for description purposes, and descriptions and reference numerals in the drawings are omitted from the other side.

Figure 4B:
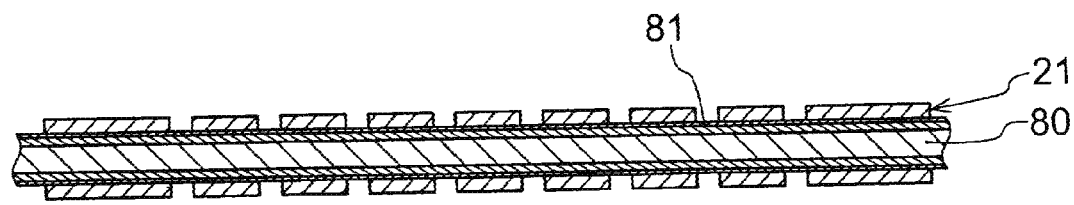
FIG. 4B is a view illustrating a step in the method for manufacturing the printed wiring board shown in FIG. 1.

First conductive layer 21 is formed on base metal foil 81 as shown in FIG. 4B. First conductive layer 21 may be formed by any method; for example, electroplating may be employed. More specifically, first, plating resist film (not shown) is formed on base metal foil 81 in predetermined portions excluding where first conductive layer 21 is formed. Next, on portions of base metal foil 81 where no plating resist film is formed, plated film by electroplating, for example, is formed using base metal foil 81 as a seed layer. Then, the plating resist film is removed. As a result, first conductive layer 21 made of electroplated film is formed on base metal foil 81 as shown in FIG. 4B. First conductive layer 21 is electroplated film, preferably made of copper.

Figure 4C:
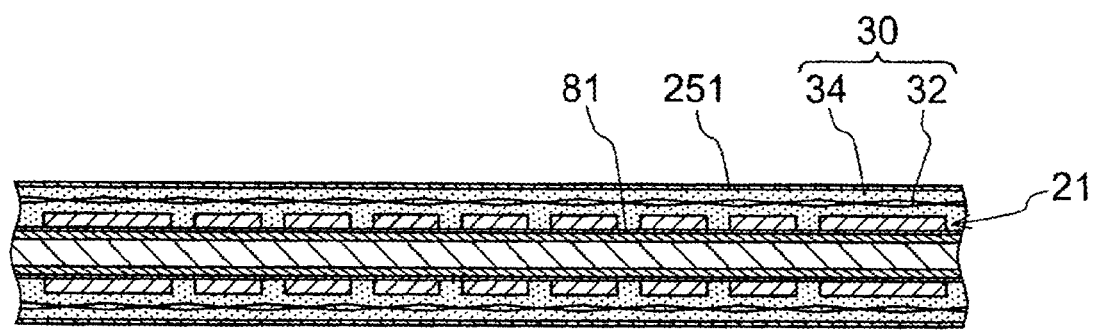
FIG. 4C is a view illustrating a step in the method for manufacturing the printed wiring board shown in FIG. 1.

On base metal foil 81 and on first conductive layer 21, semicured insulative material (prepreg) is laminated, on which metal foil 251 is further laminated. Then, pressure is exerted on metal foil 251 and on the insulative material toward support plate 80, and then heat is applied thereon. As a result, the insulative material is completely cured, resulting in first interlayer resin insulation layer 30 being bonded to base metal foil 81, first conductive layer 21 and metal foil 251 as shown in FIG. 4C. In FIG. 4C, first interlayer resin insulation layer 30 is shown to be formed with core material 32 and resin material 34 made of a resin composition, but first interlayer resin insulation layer 30 may be formed only with resin material 34 and not contain core material 32. Also, core material 32 may be made of inorganic fibers such as glass cloth.

Figure 4D:
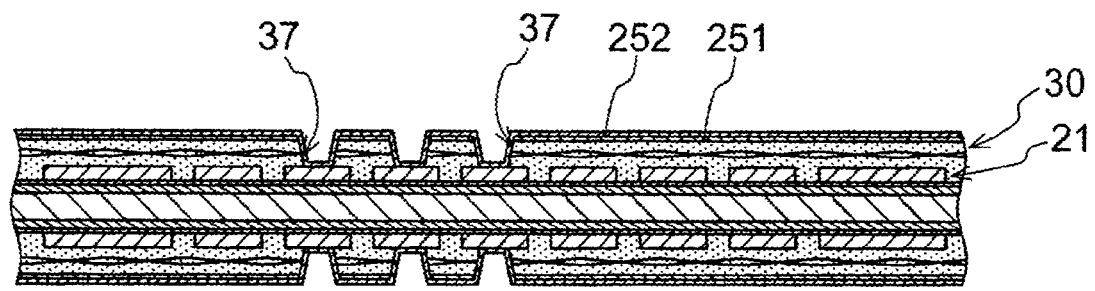
FIG. 4D is a view illustrating a step in the method for manufacturing the printed wiring board shown in FIG. 1.

As shown in FIG. 4D, holes 37 for conductor are formed to penetrate through metal foil 251 and first interlayer resin insulation layer 30 to expose first conductive layer 21. More specifically, laser beams are irradiated by using a $CO_2$ laser, for example, at predetermined portions of metal foil 251 from the metal-foil 251 side. As a result, holes 37 for conductor are formed as shown in FIG. 4D. Desmearing is preferred to be performed in holes 37 for conductor after the holes are formed. Also, the surface of metal foil 251 may be blackened before irradiating a laser to increase the absorption efficiency of laser beams. In the example shown in FIG. 4D, holes 37 for conductor are formed to have a greater size on the side irradiated by a $CO_2$ laser, namely, on the metal-foil 251 side, than on the first-conductive-layer 21 side. When holes 37 for conductor are formed in such a shape, it is effective for a plating solution to enter deep into holes 37 for conductor when first metal film 252 and second metal film 253 are formed in the next step by wet plating.

First metal film 252 is formed on metal foil 251 and in holes 37 for conductor. First metal film 252 works as a seed layer when second metal film 253 is formed by electroplating as described later. First metal film 252 is preferred to be formed by electroless plating. When first metal film 252 is formed by electroless plating, its thickness is preferred to be 0.3~1 μm. In another preferred example, first metal film 252 is formed by sputtering. When first metal film is formed by sputtering, the thickness is preferred to be 0.05~0.2 μm. The material for first metal film 252 is not limited specifically, but copper is preferred. However, the manufacturing method and material for first metal film 252 are not limited to those above, and any other method and material may also be used.

Figure 4E:
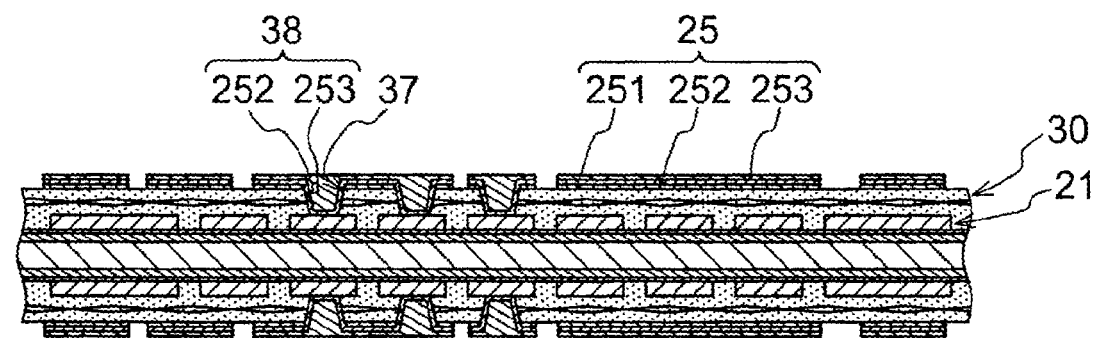
FIG. 4E is a view illustrating a step in the method for manufacturing the printed wiring board shown in FIG. 1.

As shown in FIG. 4E, second metal film 253 is formed on first metal film 252. The method for forming second metal film 253 is not limited specifically, but electroplating is preferred since a thicker film is formed in a shorter period of time. When electroplating is employed, plating resist film (not shown) is formed on first metal film 252. By excluding holes 37 for conductor, the plating resist film is formed on portions of first metal film 252 where second conductive layer 25 will not be formed. Next, second metal film 253 is formed through electroplating in holes 37 for conductor and on portions of first metal film 252 where no plating resist film is formed. As a result, second metal film 253 is filled in holes 37 for conductor, and via conductors 38 made of first and second metal films (252, 253) are formed as shown in FIG. 4E.

The plating resist film is removed, and first metal film 252 and metal foil 251 underneath that are exposed when the plating resist film is removed are etched away, for example. As a result, second conductive layer 25 made of metal foil 251, first metal film 252, and second metal film 253 is formed as shown in FIG. 4E on the surface of first interlayer resin insulation layer 30 where first conductive layer 21 is not embedded.

Figure 4F:
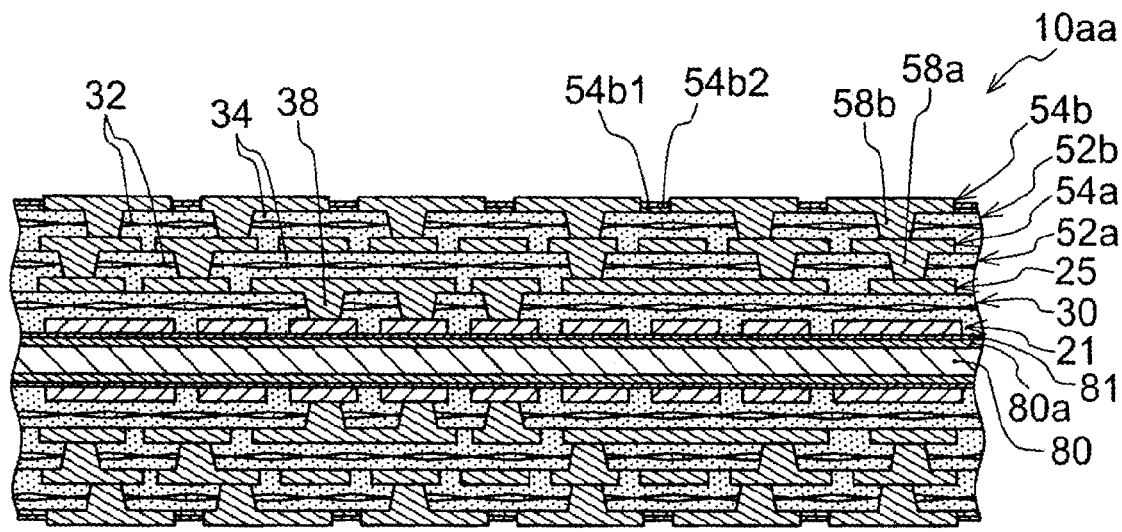
FIG. 4F is a view illustrating a step in the method for manufacturing the printed wiring board shown in FIG. 1.

As shown in FIG. 4F, on second conductive layer 25 and on portions of first interlayer resin insulation layer 30 where second conductive layer 25 is not formed, interlayer resin insulation layer (52*a*), conductive layer (54*a*), interlayer resin insulation layer (52*b*) and conductive layer (54*b*) are laminated in that order. In addition, when conductive layer (54*a*) is formed, via conductors (58*a*) are also formed to connect conductive layer (54*a*) and second conductive layer 25; and when conductive layer (54*b*) is formed, via conductors (58*b*) are also formed to connect conductive layer (54*b*) and conductive layer (54*a*). Interlayer resin insulation layer (52*a*), conductive layer (54*a*) and via conductors (58*a*), along with interlayer resin insulation layer (52*b*), conductive layer (54*b*) and via conductors (58*b*) are formed by repeating the same steps shown in FIG. 4C~4E, which are employed for forming first interlayer resin insulation layer 30, second conductive layer 25 and via conductors 38. Here, when the number of repeated steps shown in FIG. 4C~4E increases (decreases), more (fewer) interlayer resin insulation layers 52 (see FIG. 1), conductive layers 54 (see FIG. 1) and via conductors 58 (see FIG. 1) may be formed. For example, when wiring board 10 does not require many laminated layers, the subsequent steps for removing support plate 80 or the like may be conducted without repeating the steps shown in FIG. 4C~4E even once.

In FIG. 4F, interlayer resin insulation layers (52*a*, 52*b*) are shown to contain core material 32. However, those interlayer resin insulation layers may also be formed by using only resin material 34 made of a resin composition without core material 32. In addition, core material 32 may be inorganic fiber such as glass cloth. Also, resin material 34 may contain inorganic filler (not shown) such as silica at an approximate content of 30~70 wt. %.

In a step for forming conductive layer (54*b*), portions of metal foil (54*b*1) and first metal film (54*b*2) that were under the plating resist film (not shown) may remain as shown in FIG. 4F without being removed immediately after the plating resist film is removed. The remaining portions of metal foil (54*b*1) and first metal film (54*b*2) can be removed together with base metal foil 81 as described later. Here, in the example shown in FIG. 4F, via conductors (58*a*, 58*b*) are each formed to have a horizontal cross section that becomes greater (smaller) in the same direction as that of via conductors 38.

Figure 4G:
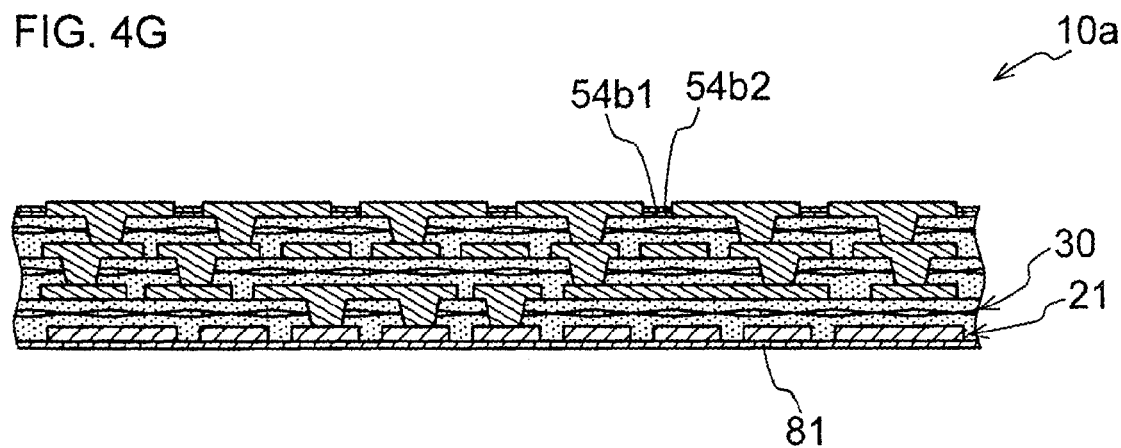
FIG. 4G is a view illustrating a step in the method for manufacturing the printed wiring board shown in FIG. 1.

Next, support plate 80 and carrier copper foil (80*a*) are separated from base metal foil 81. More specifically, first, intermediate wiring substrate (10*aa*) shown in FIG. 4F is heated to soften the thermoplastic adhesive (not shown) that bonds carrier copper foil (80*a*) and base metal foil 81. Then, in a direction along the interface with base metal foil 81, force is exerted on carrier copper foil (80*a*) and support plate 80 so as to separate them from base metal foil 81. When the carrier copper foil and base metal foil are bonded by an adhesive or by ultrasonic bonding in portions near peripheries, carrier copper foil (80*a*), base metal foil 81 and support plate 80 as well as first interlayer resin insulation layer 30 and the like are cut along the inner peripheries of the bonded portions so that the portions bonded by an adhesive or the like are discarded. Accordingly, carrier copper foil (80*a*) is separated from base metal foil 81. As a result, intermediate wiring substrate (10*aa*) shown in FIG. 4F is divided into two individual intermediate substrates. Intermediate wiring substrate (10*a*), in a state after being divided, is shown in FIG. 4G. FIG. 4G shows only an intermediate wiring substrate which was positioned on the upper side of support plate 80 in FIG. 4F.

Figure 4H:
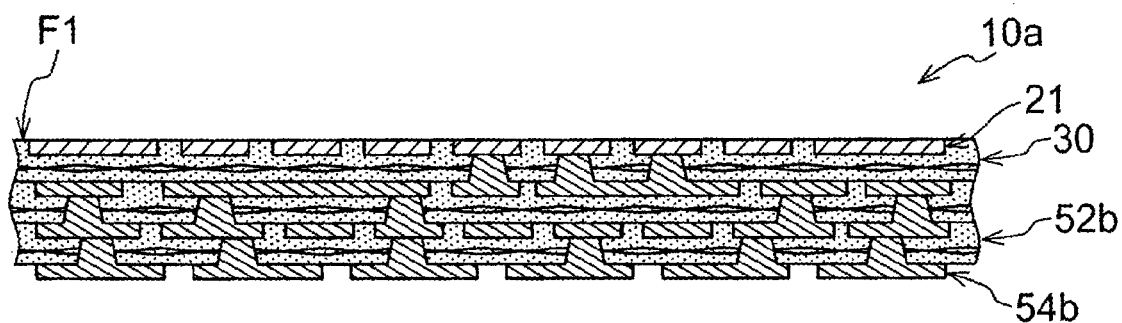
FIG. 4H is a view illustrating a step in the method for manufacturing the printed wiring board shown in FIG. 1.
Figure 4I:
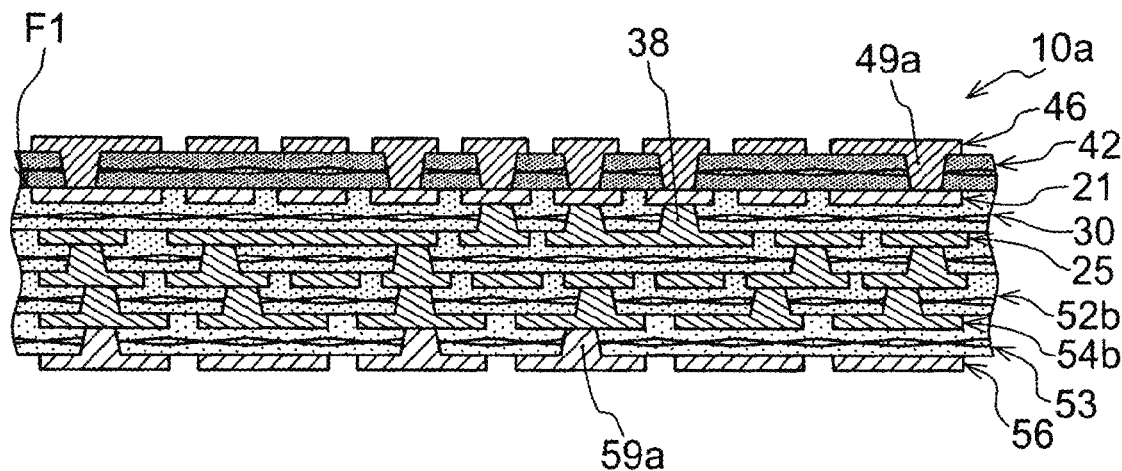
FIG. 4I is a view illustrating a step in the method for manufacturing the printed wiring board shown in FIG. 1.
Figure 4J:
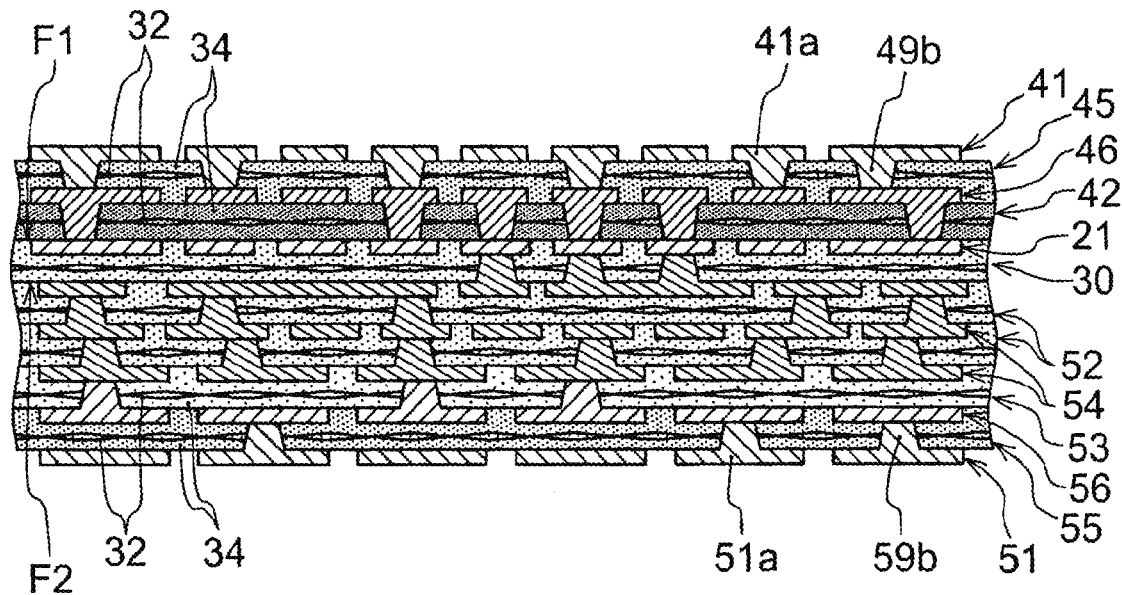
FIG. 4J is a view illustrating a step in the method for manufacturing the printed wiring board shown in FIG. 1.
Figure 4K:
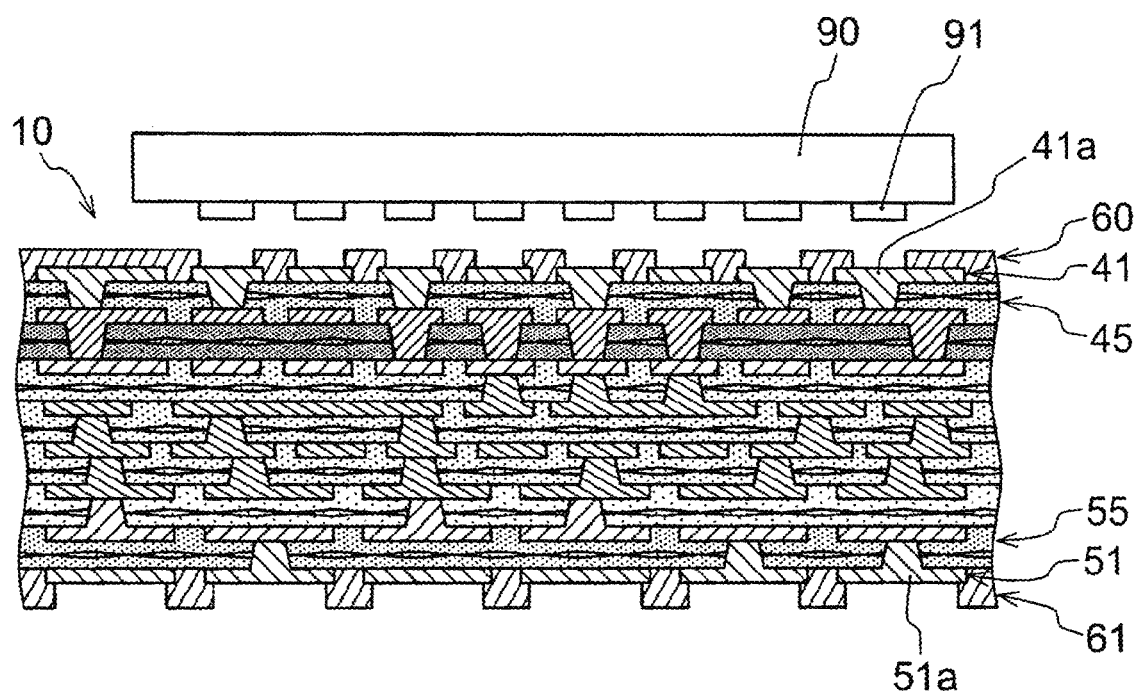
FIG. 4K is a view illustrating a step in the method for manufacturing the printed wiring board shown in FIG. 1.

Base metal foil 81 is removed by etching, for example. As described earlier, even if portions of metal foil (54*b*1) and first metal film (54*b*2) that were under the plating resist film (not shown) still remain, they are removed along with base metal foil 81 in the step for removing base metal foil 81. As described, if metal foil (54*b*1) and first metal film (54*b*2) are removed in the same step for removing base metal foil 81, at least one etching process is omitted. Thus, the manufacturing process of wiring boards is shortened while manufacturing costs are reduced. When base metal foil 81 is removed, one surface of first conductive layer 21 is exposed as shown in FIG. 4H. In FIG. 4H, intermediate wiring substrate (10*a*) is rotated 180 degrees along an axis perpendicular to the drawing sheet so that the wiring substrate shown in FIG. 4G faces the same direction as that of wiring board 10 shown in FIG. 1. In the following, intermediate wiring substrate (10*a*) and wiring board 10 in FIG. 4I~4K are positioned in the same direction as that in FIG. 4H.

On first surface (F1) of first interlayer resin insulation layer 30 exposed by removing base metal foil 81 and on the surface of first conductive layer 21 exposed on first surface (F1), second interlayer resin insulation layer 42 is laminated. Furthermore, via conductors (49*a*) are formed to penetrate through second interlayer resin insulation layer 42, and conductive layer 46 is formed on second interlayer resin insulation layer 42. Then, interlayer resin insulation layer 53 is laminated on conductive layer (54*b*) and on portions of interlayer resin insulation layer (52*b*) where conductive layer (54*b*) is not formed. Moreover, via conductors (59*a*) are formed to penetrate through interlayer resin insulation layer 53, and conductive layer 56 is formed on interlayer resin insulation layer 53. Second interlayer resin insulation layer 42, conductive layer 46 and via conductors (49*a*), as well as interlayer resin insulation layer 53, conductive layer 56 and via conductors (59*a*), are formed by repeating the steps shown in FIG. 4C~4E, the same steps employed for forming first interlayer resin insulation layer 30, conductive layer 25 and via conductors 38. Accordingly, detailed descriptions for those steps by referring to drawings are omitted, and are outlined below.

First, on first surface (F1) of first interlayer resin insulation layer 30, on conductive layer (54*b*) and on portions of interlayer resin insulation layer (52*b*) where conductive layer (54*b*) is not formed, semicured insulative material (prepreg) and metal foil are laminated and bonded by applying pressure and heat. Accordingly, second interlayer resin insulation layer 42 is formed on first surface (F1) while interlayer resin insulation layer 53 is formed on interlayer resin insulation layer (52b) and conductive layer (54b). Next, holes for conductor that penetrate through the metal foil on the second interlayer resin insulation layer 42 side and through second interlayer resin insulation layer 42 are formed to expose first conductive layer 21, while holes for conductor that penetrate through the metal foil on the interlayer resin insulation layer 53 side and through interlayer resin insulation layer 53 are formed to expose conductive layer (54b). Those holes for conductor are formed by irradiating laser beams, for example, from the metal-foil-side surface. Next, first metal film is formed on metal foil and in holes for conductor by preferably using electroless plating or sputtering. Next, second metal film is formed on the first metal film preferably by electroplating. In such a case, while excluding portions above the holes for conductor, plating resist film is formed on portions of first metal film where conductive layers (46, 56) are not formed. Then, in holes for conductor and on portions of first metal film where plating resist film is not formed, second metal film is formed by electroplating. As a result, second metal film is filled in holes for conductor, via conductors (49a) are formed in second interlayer resin insulation layer 42, and via conductors (59a) are formed in interlayer resin insulation layer 53 as shown in FIG. 4I. Then, the plating resist film is removed, then first metal film exposed by removal of the plating resist film and the metal foil underneath the metal film are removed by etching or the like. Accordingly, conductive layer 46 is formed on second interlayer resin insulation layer 42 and conductive layer 56 is formed on interlayer resin insulation layer 53 as shown in FIG. 4I.

In the method for manufacturing wiring board 10 according to the present embodiment, more interlayer resin insulation layers and conductive layers are further laminated. In particular, on conductive layer 46 and on portions of second interlayer resin insulation layer 42 where conductive layer 46 is not formed, third interlayer resin insulation layer 45 is laminated, and via conductors (49b) are formed to penetrate through third interlayer resin insulation layer 45 while third conductive layer 41 is formed on third interlayer resin insulation layer 45. In addition, on conductive layer 56 and on portions of interlayer resin insulation layer 53 where conductive layer 56 is not formed, fourth interlayer resin insulation layer 55 is laminated, and via conductors (59b) are formed to penetrate through fourth interlayer resin insulation layer 55 while fourth conductive layer 51 is formed on fourth interlayer resin insulation layer 55. Third interlayer resin insulation layer 45, third conductive layer 41 and via conductors (49b), as well as fourth interlayer resin insulation layer 55, fourth conductive layer 51 and via conductors (59b), are formed by repeating the aforementioned steps for forming second interlayer resin insulation layer 42, conductive layer 46 and via conductors (49a), as well as the steps for forming interlayer resin insulation layer 53, conductive layer 56 and via conductors (59a). FIG. 4J shows a state where the intermediate substrate is formed all the way to third and fourth conductive layers (41, 51). By providing plating resist film with appropriate patterns, corresponding to the plating resist film that was formed on the first metal film as described above in the step for forming conductive layer 46, third conductive layer 41 is patterned to include connection pads (41a) and the like in the step for forming third conductive layer 41 as shown in FIG. 4J. In the same manner, fourth conductive layer 51 is formed in predetermined patterns that include connection pads (51a) and the like.

Before third and fourth interlayer resin insulation layers (45, 55) and third and fourth conductive layers (41, 51) are formed, even more interlayer resin insulation layers, conductive layers and via conductors may be formed on conductive layer 46 and/or conductive layer 56. Such interlayer resin insulation layers, conductive layers and via conductors may be formed by the same steps for forming aforementioned third and fourth interlayer resin insulation layers (45, 55), third and fourth conductive layers (41, 51) and via conductors (49b, 59b). Also, when forming more layers, the number of interlayer resin insulation layers 52 (see FIG. 1) and conductive layers 54 (see FIG. 1) may be adjusted. Namely, multiple conductive patterns to be formed in wiring board 10 may each be provided on any of the conductive layers formed before the step shown in FIG. 4G when support plate 80 is separated, or on any of the conductive layers formed after the step shown in FIG. 4G. As a result of such options, the numbers of interlayer resin insulation layers and conductive layers formed before the separation of support plate 80, and the numbers of interlayer resin insulation layers and conductive layers formed after the separation of support plate 80, may increase or decrease.

As first conductive layer 21, a conductive layer formed to be embedded in an interlayer resin insulation layer is easier to pattern without conducting etching, and strong adhesion is achieved with the interlayer resin insulation layer, while the risk of short circuiting among wiring lines is low. Thus, it is effective to form wiring patterns with a narrow pitch. As shown in FIGS. 4B and 4C, such an embedded conductive layer is formed on one surface of support plate 80, which is eventually separated. Thus, interlayer resin insulation layers and conductive layers for a multilayer structure are laminated only in one direction. Accordingly, even when first interlayer resin insulation layer 30 and the like are formed on both surfaces of support plate 30 as shown in FIG. 4A~4F, the procedure for finishing one wiring board 10 may take longer, resulting in a prolonged production lead time and an increase in the number of intermediate substrates.

In the method for manufacturing wiring board 10 according to the present embodiment, after first conductive layer 21 is formed, support plate 80 is separated. Then, a step for forming second interlayer resin insulation layer 42, third interlayer resin insulation layer 45 and the like, and a step for forming interlayer resin insulation layer 53, fourth interlayer resin insulation layer 55 and the like, can be performed simultaneously on both surfaces of intermediate wiring substrate (10a). Thus, the production lead time from the beginning to finish for wiring board 10 is shortened compared with a method for forming all interlayer resin insulation layers and conductive layers before support layer 80 is separated.

In the method for manufacturing wiring board 10 according to the present embodiment, since first conductive layer 21 is embedded in first surface (F1) of first interlayer resin insulation layer 30, second interlayer resin insulation layer 42 laminated on first surface (F1) is formed thicker than any of first interlayer resin insulation layer 30, third and fourth interlayer resin insulation layers (45, 55), interlayer resin insulation layer 52 and interlayer resin insulation layer 53 as shown in FIG. 4J. In addition, since first conductive layer 21 is embedded, first surface (F1) of interlayer resin insulation layer 30 is made substantially a flat surface. In the method for manufacturing wiring board 10 according to the present embodiment, support plate 80 is not separated immediately after first conductive layer 21 is formed, but is separated after interlayer resin insulation layer 52 and conductive layer 54 are formed on the second surface (F2) side of first interlayer resin insulation layer 30 (see FIG. 4F). Then, interlayer resin insulation layers and conductive layers are simultaneously formed on both sides. Accordingly, second interlayer resin insulation layer 42 thicker than other interlayer resin insulation layers is positioned toward the first surface (SF1) side of wiring board 10 (see FIG. 1). As a result, warping in wiring board 10 is effectively reduced as described above, thereby preventing a decrease in the connection reliability of an electronic component (not shown) to be mounted on wiring board 10. Also, substantially flat first surface (F1) is positioned closer to first surface (SF1) of wiring board 10. Thus, undulations that appear on first surface (SF1) of wiring board 10 are effectively suppressed, thus preventing a decrease in mounting yield when an electronic component is mounted on first surface (SF1).

When via conductors 49 are formed above, holes for forming via conductors 49 are formed by irradiating laser beams at second interlayer resin insulation layer 42 or third interlayer resin insulation layer 45 from the side to form third conductive layer 41. On the other hand, laser beams for forming holes for via conductors 59 are irradiated at interlayer resin insulation layer 53 or fourth interlayer resin insulation layer 55 from the side to form fourth conductive layer 51 in the same direction to irradiate laser beams when forming holes (not shown) for via conductors 38 (see FIG. 4E) and via conductors (58a, 58b) (see FIG. 4F). Accordingly, as shown in FIG. 1, via conductors (49a, 49b) and via conductors (38, 58, 59a, 59b) are respectively shaped in horizontal cross sections that become greater (smaller) in opposite directions from each other.

In FIG. 4J, second through fourth interlayer resin insulation layers (42, 45, 55) and interlayer resin insulation layer 53 are shown to contain core material 32. However, those interlayer resin insulation layers may be formed by using only resin material 34 made of a resin composition without including core material 32. In addition, core material 32 may be made of inorganic fiber such as glass cloth. Also, resin material 34 may contain inorganic filler (not shown) such as silica at an approximate content of 30~70 wt. %.

In the method for manufacturing wiring board 10 according to the present embodiment, as shown in FIG. 4K, solder-resist layer 60 is formed on part of the surface of third conductive layer 41 excluding connection pads (41a) and on the surface of third interlayer resin insulation layer 45 where third conductive layer 41 is not formed. Also, solder-resist layer 61 is formed on part of the surface of fourth conductive layer 51 excluding connection pads (51a) and on the surface of fourth interlayer resin insulation layer 55 where fourth conductive layer 51 is not formed.

Solder-resist layers (60, 61) are formed as follows: photosensitive epoxy layer, for example, is formed on the entire surface of third interlayer resin insulation layer 45 and third conductive layer 41 as well as on the entire surface of fourth interlayer resin insulation layer 55 and fourth conductive layer 51, and then predetermined portions to form solder-resist layers (60, 61) are exposed to light and portions of the epoxy layer that were not exposed are developed and removed. However, that is not the only option, and solder-resist layers (60, 61) may be provided by other methods such as screen printing that uses a mask with openings in a predetermined pattern. Alternatively, solder-resist layers (60, 61) may also be formed as follows: a non-photosensitive epoxy-resin layer, for example, is formed on the entire surface of third interlayer resin insulation layer 45 and third conductive layer 41 as well as on the entire surface of fourth interlayer resin insulation layer 55 and fourth conductive layer 51, and unwanted portions to form solder resist layers (60, 61) are removed by a laser.

In addition, on surfaces of connection pads (41a, 51a) exposed from solder-resist layers (60, 61), anticorrosion layers (not shown) may be formed using Ni/Au, Ni/Pd/Au, Sn or the like. Moreover, anticorrosion layers made of organic solderability preservative (OSP) may be formed by immersing in or spraying liquid preservative material, or solder coating layers (not shown) may be formed.

By conducting steps shown in FIG. 4A-4K, wiring board 10 of the present embodiment shown in FIG. 1 is completed. As shown in FIG. 4K, electronic components such as semiconductor element 90 may be mounted on connection pads (41a), for example, of completed wiring board 10. In the same manner, another electronic component (not shown) may be connected to mounting pads (51a). In addition, wiring board 10 may be connected to an external circuit such as another wiring board through connection pads (41a, 51a).

The method for manufacturing wiring board 10 according to the present embodiment is not limited to that described with reference to FIG. 4A~4K, and the conditions and orders for processing steps may be modified as desired. In addition, a step may be omitted or another step may be added.

Figure 5A:
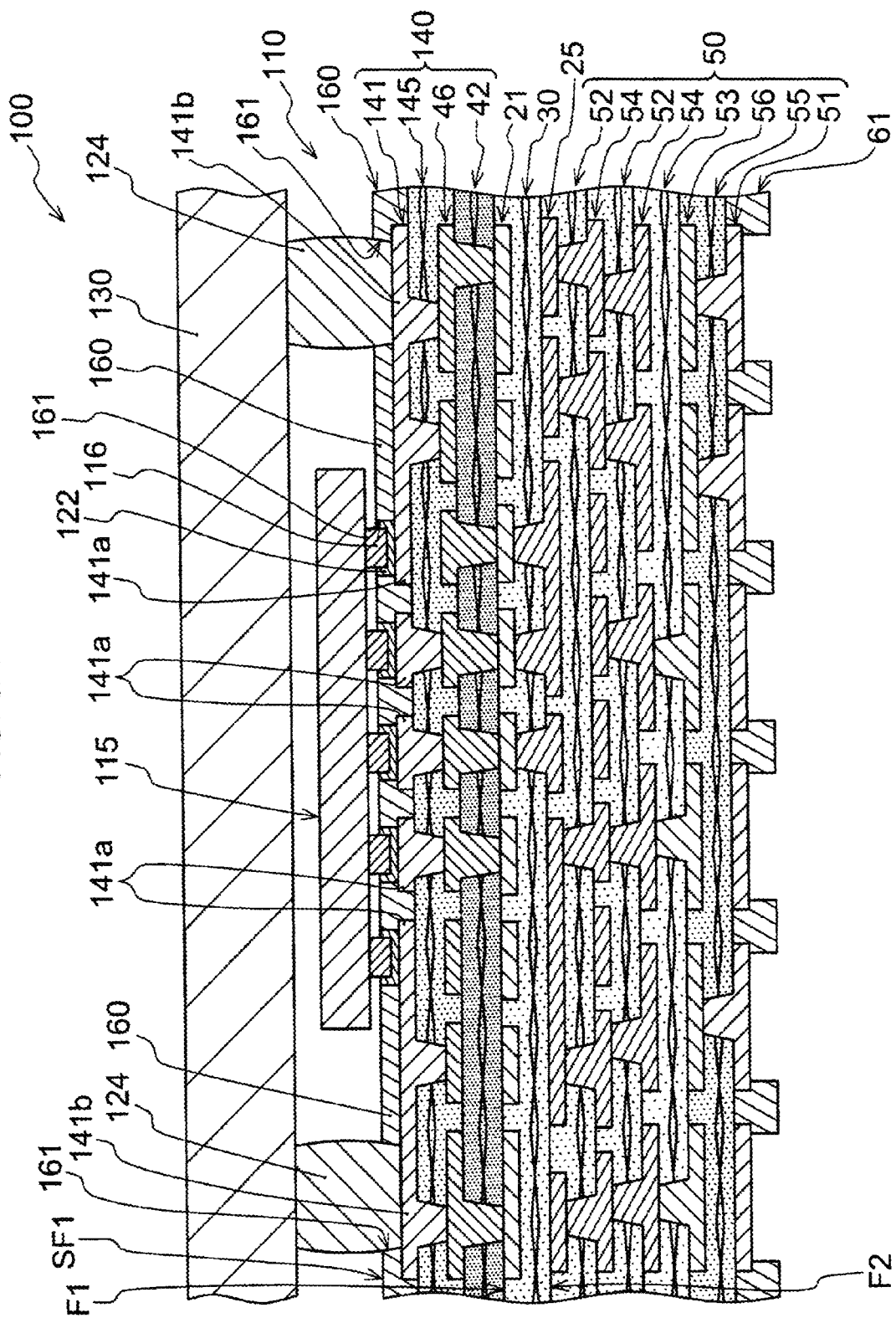
FIG. 5A is a cross-sectional view of an example of the semiconductor package according to an embodiment of the present invention.

Next, a semiconductor package according to another embodiment of the present invention is described by referring to the accompanying drawings. As shown in FIG. 5A, semiconductor package 100 of the present embodiment includes printed wiring board 110 with first semiconductor element 115 mounted on surface (SF1), and substrate 130 mounted on surface (SF1) of printed wiring board 110. The printed wiring board, shown in FIG. 1 as an example, is preferred to be used as printed wiring board 110. FIG. 5A shows an example in which the printed wiring board shown in FIG. 1 is used as printed wiring board 110. Thus, the structure of printed wiring board 110 shown in FIG. 5A is mostly the same as that of printed wiring board 10 shown in FIG. 1, the same numerical reference is applied to the identical structural element, and its detailed description is omitted here. However, printed wiring board 110 is not limited to printed wiring board 10 shown in FIG. 1, and various modifications and changes in each structural element as described above may be employed.

As shown in FIG. 5A, printed wiring board 110 has first buildup layer 140 the same as printed wiring board 10 shown in FIG. 1. On the surface (SF1) side of printed wiring board 110, third conductive layer 141 is formed on the outermost layer of first buildup layer 140, and solder-resist layer 160 is formed on third conductive layer 141. Solder-resist layer 160 has openings 161 in predetermined positions, and connection pads (141a, 141b) which are part of third conductive layer 141 are exposed through openings 161 of solder-resist layer 160.

Substrate 130 has bumps 124 on the wiring-board 110 side surface. Bumps 124 are connected to connection pads (141b) which are part of third conductive layer 141 of printed wiring board 110.

First semiconductor element 115 is arranged in a space, which is positioned between printed wiring board 110 and substrate 120 and secured to have a height corresponding to the height of bumps 124. In addition, first semiconductor element 115 has electrodes 116, which are connected by way of bonding material 122 to connection pads (141a), which are part of third conductive layer 141 of printed wiring board 110.

Semiconductor package 100 of the present embodiment has printed wiring board 110, which is the same as printed wiring board 10 shown in FIG. 1 as an embodiment. Thus, warping of printed wiring board 110 is suppressed as described above, and connection reliability between first semiconductor element 115 and substrate 120 is thereby prevented from lowering. Moreover, since undulations are suppressed from appearing on the surface of printed wiring board 110, the mounting yield of first semiconductor element 115 is prevented from lowering.

The structure and material for substrate 130 are not limited specifically; for example, substrates such as follows may be employed: a printed wiring board formed with interlayer resin insulation layers made of resin material and conductive layers made of copper foil; a wiring board prepared by forming conductive film on the surface of an insulative base made of inorganic material such as alumina and aluminum nitride; and a motherboard manufactured by a method described in FIG. 8~13 of WO2011/122246. The entire contents of this publication are incorporated herein by reference. In addition, first semiconductor element 115 is not limited to any specific type, and any semiconductor element such as a microcomputer, memory or ASIC may be used. Third conductive layer 141 and solder-resist layer 160 can be formed by using the same material and method as those for third conductive layer 41 and solder-resist layer 60 of the aforementioned printed wiring board 10.

The material for bonding material 122 and bumps 124 is not limited specifically; any conductive material, preferably metals such as solder, gold and copper, may be used. Also, without using bonding material 122, electrodes 116 of first semiconductor element 115 and connection pads (141*a*) may be connected when metal bonding portions are formed between them by applying heat, pressure and/or excitation.

Figure 5B:
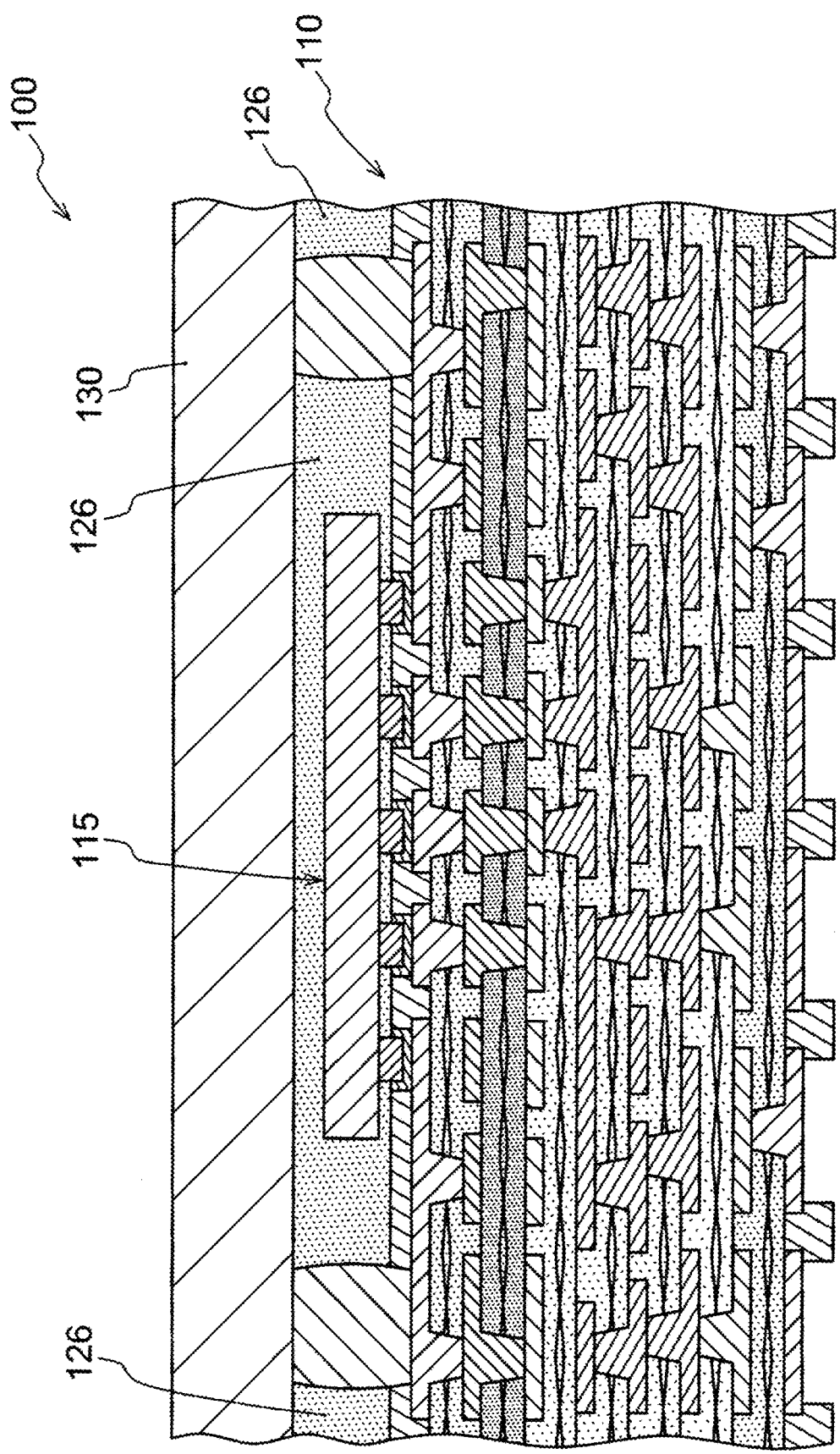
FIG. 5B is a cross-sectional view of another example of the semiconductor package according to the embodiment of the present invention.

FIG. 5B shows an example of semiconductor package 100 shown in FIG. 5A in which molding resin 126 is filled between printed wiring board 110 and substrate 130. When molding resin 126 is filled in the package, first semiconductor element 115 is protected from mechanical stress, while movement of printed wiring board 110 caused by ambient temperature change is limited so as to reduce stress generated in connection portions of first semiconductor element 115. Accordingly, such a structure is effective to enhance connection reliability. The material for molding resin 126 is not limited specifically; for example, a material having a thermal expansion coefficient similar to that of first semiconductor element 115 and having excellent insulation properties may be used. It is preferred to use a thermosetting epoxy resin containing filler such as silica at a high content. The method for filling molding resin 126 is not limited specifically; for example, it may be filled by transferring mold inside a die (not shown), or a liquid type resin may be injected and cured by applying heat thereon.

Figure 5C:
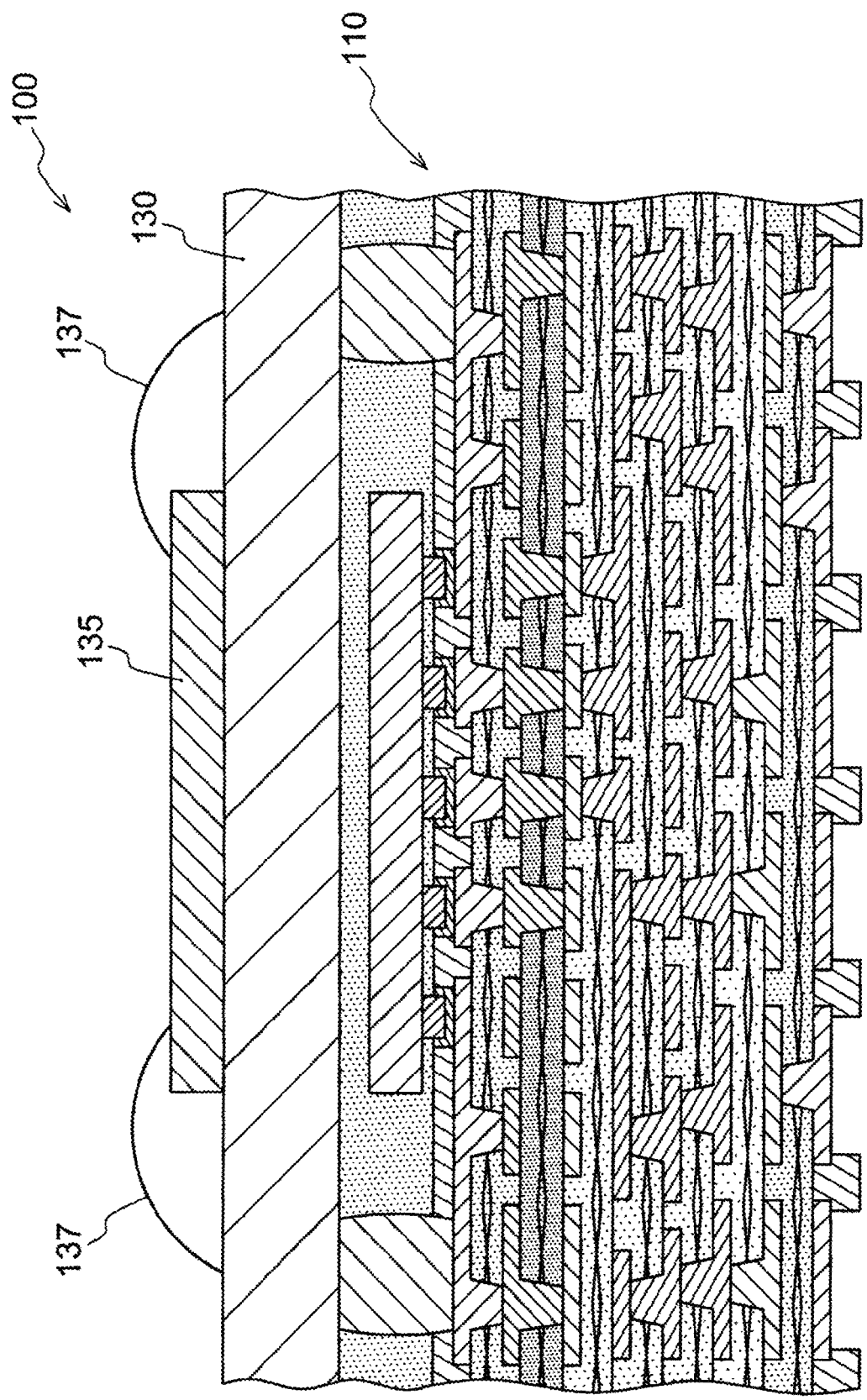
FIG. 5C is a cross-sectional view of yet another example of the semiconductor package according to the embodiment of the present invention.

FIG. 5C shows an example in which second semiconductor element 135 is mounted on substrate 130 of semiconductor package 100 shown in FIG. 5B. Electrodes (not shown) provided on one surface of second semiconductor element 135 are connected to substrate 130 by bonding wires 137 as shown in FIG. 5C, or they may be connected by flip-chip bonding by inverting second semiconductor element 135 so that the surface where the electrodes are formed faces substrate 130. When a semiconductor package is set as a package-on-package structure by mounting second semiconductor element 135, a semiconductor device is formed to have a smaller planar size and to be highly functional.

In recent years, as the circuits of electronic devices have become more complex, the number of electrodes in electronic components is increasing, while miniaturization of electronic devices is rapidly progressing. In such trends, printed wiring boards may have high-density wiring patterns capable of mounting semiconductor elements with numerous narrow-pitched bump electrodes or land electrodes at a high yield. Buildup wiring boards may be used as printed wiring boards having high-density patterns. Buildup wiring boards may be formed using a core substrate such as a double-sided copper-clad laminate or a laminate formed by alternately laminating multiple insulation layers and conductive layers, and further laminating insulation layers and conductive layers on both surfaces of such a core substrate to form buildup layers.

Figure 6:
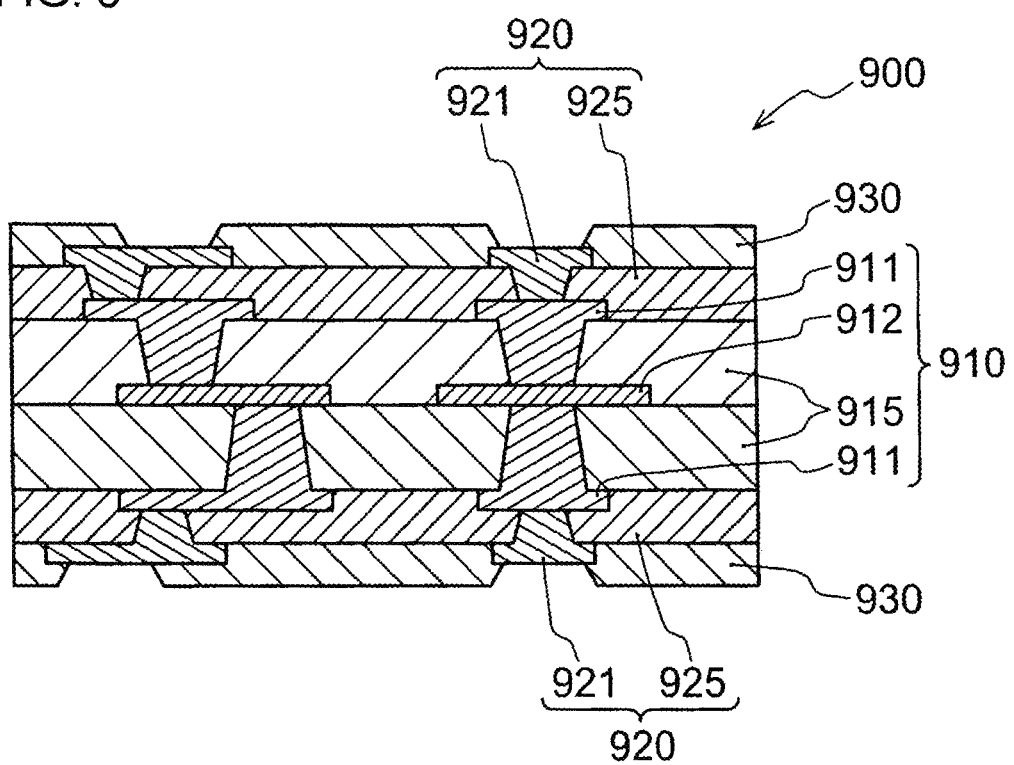
FIG. 6 is a cross-sectional view of a printed wiring board according to conventional technology.

For example, in buildup wiring board 900 in FIG. 6, conductive layers (911, 911) on both surfaces of core substrate (910) may be each formed to have a predetermined pattern on a surface of insulation layer (915). Thus, on both upper and lower surfaces of core substrate (910) where buildup layers (920, 920) are to be laminated, concavo-convex patterns derived from the thickness of conductive layer (911, 911) are present. When such concavo-convex patterns are present, undulations may occur on both surfaces of buildup wiring board 900. In addition, when more conductive layers and insulation layers are formed in core substrate (910) and/or in buildup layer (920) due to a decrease in the planar size of a wiring board and an increase in the number of wiring lines, undulations with even greater height differences occur on both surfaces of the wiring board, caused by accumulated concavo-convex patterns derived from each conductive layer. When a semiconductor element (not shown) is connected to conductive layer (921) where such undulations are apparent, not all the electrodes of the semiconductor element are able to make contact with conductive layer (921), and the mounting yield of the semiconductor element or the like is lowered.

A printed wiring board according to an embodiment of the present invention has a flat surface, and a semiconductor package according to another embodiment of the present invention utilizes such a printed wiring board.

A printed wiring board according to an aspect of the present invention has the following: a first interlayer resin insulation layer having a first surface and a second surface opposite the first surface; a first conductive layer formed on the first surface of the first interlayer resin insulation layer; a second conductive layer formed on the second surface of the first interlayer resin insulation layer; a first buildup layer formed on the first surface of the first interlayer resin insulation layer and on the first conductive layer by laminating an interlayer resin insulation layer and a conductive layer from the first-surface side; and a second buildup layer formed on the second surface of the first interlayer resin insulation layer and on the second conductive layer by laminating an interlayer resin insulation layer and a conductive layer from the second-surface side. The first conductive layer is embedded in the first interlayer resin insulation layer in such a way to expose its surface on the first surface, the second conductive layer is formed on the second surface, and the second interlayer resin insulation layer of the first buildup layer positioned adjacent to the first conductive layer is set to be the thickest among the first interlayer resin insulation layer, interlayer resin insulation layers in the first buildup layer, and the interlayer resin insulation layers in the second buildup layer.

In addition, a semiconductor package according to another aspect of the present invention is provided with a printed wiring board having a first semiconductor element mounted on one surface and a substrate mounted on the one surface of the printed wiring board. The printed wiring board includes a first interlayer resin insulation layer having a first surface and a second surface opposite the first surface; a first conductive layer formed on the first surface of the first interlayer resin insulation layer; a second conductive layer formed on the second surface of the first interlayer resin insulation layer; a first buildup layer formed on the first surface of the first interlayer resin insulation layer and on the first conductive layer by laminating an interlayer resin insulation layer and a conductive layer from the first-surface side and further laminating a third conductive layer on the uppermost surface; a second buildup layer formed on the second surface of the first interlayer resin insulation layer and on the second conductive layer by laminating an interlayer resin insulation layer and a conductive layer from the second-surface side; and a solder-resist layer formed on the third conductive layer.

The first conductive layer is embedded in the first interlayer resin insulation layer in such a way to expose one of its surfaces on the first surface, the second conductive layer is formed on the second surface, among the interlayer resin insulation layers in the first buildup layer, the second interlayer resin insulation layer positioned adjacent to the first conductive layer is set to be the thickest among the first interlayer resin insulation layer, interlayer resin insulation layers in the first buildup layer, and the interlayer resin insulation layers in the second buildup layer, bumps are formed on the substrate surface facing the printed wiring board, and the bumps are connected to the third conductive layer exposed in opening portions formed in the solder-resist layer.

A printed wiring board according to an embodiment of the present invention may be structured to have a wiring assembly formed by alternately laminating an interlayer resin insulation layer and a conductive layer and provided with conductive layers on one surface and its opposing surface respectively; a first buildup layer formed on the one surface of the wiring assembly by alternately laminating an interlayer resin insulation layer and a conductive layer multiple times; and a second buildup layer formed on the other surface of the wiring assembly by alternately laminating an interlayer resin insulation layer and a conductive layer multiple times. The conductive layer provided on the one surface is embedded in the uppermost interlayer resin insulation layer positioned on the one-surface side of the wiring assembly in such a way to expose one of its surfaces from the uppermost interlayer resin insulation layer, the conductive layer provided on the other surface is formed on the uppermost interlayer resin insulation layer on the other-surface side of the wiring assembly, and the interlayer resin insulation layer of the first buildup layer adjacent to the one surface of the wiring assembly is set to be the thickest among the interlayer resin insulation layers in the first buildup layer, the interlayer resin insulation layers in the second buildup layer, and the interlayer resin insulation layers of the wiring assembly.

Moreover, a method for manufacturing a printed wiring board according to yet another aspect of the present invention includes the following: forming a first conductive layer having predetermined patterns on at least one surface of a support plate; laminating a first interlayer resin insulation layer and a metal foil on the first conductive layer; forming holes for conductor penetrating through the first interlayer resin insulation layer and the metal foil; forming a seed layer in the holes for conductor and on the metal foil; forming via conductors and a second conductive layer on predetermined portions of the seed layer by electroplating; separating the first conductive layer and the first interlayer resin insulation layer from the support plate; forming a second interlayer resin insulation layer by laminating insulative material on the first conductive layer; and forming an interlayer resin insulation layer by laminating insulative material on the second conductive layer or on a buildup layer laminated on the second conductive layer. The first conductive layer is embedded in the first surface in such a way to expose one surface from the first interlayer resin insulation layer, and the second interlayer resin insulation layer is thicker than any of the first interlayer resin insulation layer and interlayer resin insulation layers laminated on the second-conductive-layer side of the first interlayer resin insulation layer.

According to one aspect of the present invention, since a first conductive layer is embedded in the first interlayer resin insulation layer in such a way that one surface is exposed on the first surface of the first interlayer resin insulation layer, the first surface of the first interlayer resin insulation layer is made substantially flush with the one surface of the first conductive layer. Accordingly, when a first buildup layer is formed on the first surface, the upper surface of the first buildup layer, namely, the upper surface of the printed wiring board, is less likely to show undulations. In addition, since the concavo-convex patterns of each conductive layer are less likely to accumulate, undulations with greater height differences are less likely to appear on the upper surface of the printed wiring board. As a result, connection failures seldom occur between an electronic component mounted on the printed wiring board and the conductive patterns of the printed wiring board, and the mounting yield of an electronic component on the printed wiring board thereby improves. In the same manner, the production yield of a semiconductor package using the printed wiring board also improves.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a first resin insulation interlayer;
a first conductive layer formed on a first-surface side of the first resin insulation interlayer;
a second conductive layer formed on a second-surface side of the first resin insulation interlayer on an opposite side with respect to the first-surface side;
a first buildup layer comprising a plurality of resin insulation interlayers and a plurality of conductive layers and formed on a first surface of the first resin insulation interlayer such that the first buildup layer is formed on the first conductive layer; and
a second buildup layer comprising a plurality of resin insulation interlayers and a plurality of conductive layers and formed on a second surface of the first resin insulation interlayer such that the second buildup layer is formed on the second conductive layer,
wherein the first conductive layer is formed such that the first conductive layer is embedded in the first resin insulation interlayer and exposing a surface on the first surface of the first resin insulation interlayer, the second conductive layer is formed on the second surface of the first resin insulation interlayer, and the plurality of resin insulation interlayers in the first buildup layer includes a second resin insulation interlayer positioned adjacent to the first conductive layer and having the greatest thickness among the first resin insulation interlayer, resin insulation interlayers in the first buildup layer, and resin insulation interlayers in the second buildup layer.

2. A printed wiring board according to claim 1, wherein the first buildup layer comprises the resin insulation interlayers and the conductive layers alternately laminated, and the second buildup layer comprises the resin insulation interlayers and the conductive layers alternately laminated such that a number of the resin insulation interlayers in the second buildup layer is greater than a number of the resin insulation interlayers in the first buildup layer.

3. A printed wiring board according to claim 2, wherein the first and second buildup layers are formed such that an outermost resin insulation interlayer in the first buildup layer and an outermost resin insulation interlayer in the second buildup layer comprise same material and have a same thickness.

4. A printed wiring board according to claim 3, wherein the first and second buildup layers are formed such that the resin insulation interlayers in the first and second buildup layers positioned on same tiers from the outermost resin insulation interlayers in the first and second buildup layers comprise same material, respectively.

5. A printed wiring board according to claim 4, wherein the first resin insulation interlayer comprises material which is different from material of the outermost resin insulation interlayer in the first buildup layer.

6. A printed wiring board according to claim 1, wherein each of the resin insulation interlayers in the first and second buildup layers comprises prepreg comprising core material and rein material impregnated with the core material.

7. A printed wiring board according to claim 1, wherein each of the resin insulation interlayers in the first buildup layer comprises resin material comprising inorganic filler in an amount of 30 to 70 wt. % and not impregnated with core material.

8. A printed wiring board according to claim 1, wherein the first buildup layer is configured to mount a semiconductor component on a surface of the first buildup layer.

9. A printed wiring board according to claim 1, further comprising:
a via conductor formed through the first resin insulation interlayer;
a via conductor formed through one of the resin insulation interlayers in the first buildup layer; and
a via conductor formed through one of the resin insulation interlayers in the second buildup layer,
wherein the via conductor in the first buildup layer is formed such that a cross section of the via conductor in the first buildup layer becomes greater in a direction which is opposite to a direction in which cross sections of the via conductors in the first resin insulation interlayer and the second buildup layer become greater.

10. A semiconductor package device, comprising:
the printed wring board of claim 1;
a semiconductor component mounted on a surface of the printed wiring board; and
a substrate mounted on the surface of the printed wiring board,
wherein the printed wring board comprises an outermost conductive layer in the conductive layers of the first buildup layer and a solder resist formed on the outermost conductive layer such that the solder resist layer has a plurality of opening portions forming a plurality of exposed portions of the outermost conductive layer, and the substrate comprises a plurality of bumps connected to the plurality of exposed portions of the outermost conductive layer in the printed wiring board, respectively.

11. A semiconductor package device according to claim 10, further comprising:
a mold resin layer filling a space formed between the printed wiring board and the substrate,
wherein the semiconductor component is positioned in the space formed between the printed wiring board and the substrate and connected to the outermost conductive layer.

12. A semiconductor package device according to claim 10, further comprising:
a second semiconductor component mounted on the substrate such that the printed wiring board, the semiconductor component, the substrate and the second semiconductor component form a package-on-package structure.

13. A printed wiring board according to claim 1, wherein the first and second buildup layers are formed such that an outermost resin insulation interlayer in the first buildup layer and an outermost resin insulation interlayer in the second buildup layer comprise same material and have a same thickness, and the first resin insulation interlayer comprises material which is different from the material of the outermost resin insulation interlayer in the first buildup layer.

14. A printed wiring board, comprising:
a wiring assembly comprising a plurality of resin insulation interlayers and a plurality of conductive layers such that the plurality of conductive layers includes a conductive layer formed on a first-surface side of the wiring assembly and a conductive layer formed on a second-surface side of the wiring assembly on an opposite side with respect to the first-surface side;
a first buildup layer comprising a plurality of resin insulation interlayers and a plurality of conductive layers and formed on a first surface of the wiring assembly such that the first buildup layer is formed on the conductive layer on the first-surface side of the wiring assembly; and
a second buildup layer comprising a plurality of resin insulation interlayers and a plurality of conductive layers and formed on a second surface of the wiring assembly such that the second buildup layer is formed on the conductive layer on the second-surface side of the wiring assembly,
wherein the conductive layer on the first-surface side of the wiring assembly is formed such that the conductive layer is embedded in an outermost resin insulation interlayer on the first-surface side and exposing a surface on the first surface of the wiring assembly, the second conductive layer on the second-surface side of the wiring assembly is formed on a surface of an outermost resin insulation interlayer on the second-surface side of the wiring assembly, and the plurality of resin insulation interlayers in the first buildup layer includes a resin insulation interlayer positioned adjacent to the conductive layer on the first-surface side of the wiring assembly and having the greatest thickness among the resin insulation interlayers in the wiring assembly, resin insulation interlayers in the first buildup layer, and resin insulation interlayers in the second buildup layer.

15. A printed wiring board according to claim 14, wherein the first and second buildup layers are formed such that the resin insulation interlayers in the first and second buildup layers positioned on same tiers from the wiring assembly in the first and second buildup layers comprise same material, respectively.

16. A method for manufacturing a printed wiring board, comprising:

forming a first conductive layer on a surface of a support plate;

forming a first resin insulation interlayer on the support plate such that the first conductive layer is embedded in the first resin insulation interlayer;

laminating a metal foil on the first resin insulation interlayer;

forming a hole for a via conductor such that the hole penetrates through the first resin insulation interlayer and the metal foil;

forming a seed layer on the metal foil such that he seed layer is formed in the hole and on the metal foil;

applying electroplating on the seed layer such that a via conductor is formed in the hole and a second conductive layer is formed on the first resin insulation interlayer;

separating the support plate from the first resin insulation interlayer such that a surface of the first conductive layer embedded in the first resin insulation interlayer is exposed on a first surface of the first resin insulation interlayer;

laminating insulative material on the first surface of the first conductive layer such that a second resin insulation interlayer is formed adjacent to the first conductive layer; and laminating insulative material on a second surface of the first resin insulation interlayer such that a resin insulation interlayer is formed on the second conductive layer, wherein the second resin insulation interlayer has the greatest thickness among the first resin insulation interlayer, second resin insulation interlayer and resin insulation interlayer laminated on the second surface of the first resin insulation interlayer.

17. A method for manufacturing a printed wiring board according to claim 16, further comprising:

forming a conductive layer on the second resin insulation interlayer; and forming a conductive layer on the resin insulation interlayer laminated on the second surface of the first resin insulation interlayer.

18. A method for manufacturing a printed wiring board according to claim 16, further comprising:

forming a first buildup layer comprising a plurality of resin insulation interlayers and a plurality of conductive layers alternately laminated; and forming a second buildup layer comprising a plurality of resin insulation interlayers and a plurality of conductive layers alternately laminated such that a number of the resin insulation interlayers in the second buildup layer is greater than a number of the resin insulation interlayers in the first buildup layer.

19. A method for manufacturing a printed wiring board according to claim 18, wherein the first and second buildup layers are formed such that an outermost resin insulation interlayer in the first buildup layer and an outermost resin insulation interlayer in the second buildup layer comprise same material and have a same thickness.

20. A method for manufacturing a printed wiring board according to claim 19, wherein the first and second buildup layers are formed such that the resin insulation interlayers in the first and second buildup layers positioned on same tiers from the outermost resin insulation interlayers in the first and second buildup layers comprise same material, respectively, and the first resin insulation interlayer comprises material which is different from the material of the outermost resin insulation interlayer in the first buildup layer.

* * * * *